(12) United States Patent     (10) Patent No.:     US 12,597,948 B2

Hjorth                              (45) Date of Patent:          Apr. 7, 2026

(54) DATA VALIDATION AND CORRECTION USING HYBRID PARITY AND ERROR CORRECTING CODES

(71) Applicant: Frontgrade Gaisler AB, Gothenburg (SE)

(72) Inventor: Magnus Hjorth, Gothenburg (SE)

(73) Assignee: Frontgrade Gaisler AB, Gothenburg (SE)

( * ) Notice: Subject to any disclaimer, the term of this patent is extended or adjusted under 35 U.S.C. 154(b) by 0 days.

(21) Appl. No.: 18/397,923

(22) Filed: Dec. 27, 2023

(65) Prior Publication Data

US 2024/0243755 A1     Jul. 18, 2024

Related U.S. Application Data

(63) Continuation of application No. PCT/SE2021/050668, filed on Jul. 2, 2021.

(51) Int. Cl.
H03M 13/11 (2006.01)
H03M 13/00 (2006.01)

(52) U.S. Cl.
CPC ....... H03M 13/11 (2013.01); H03M 13/6575 (2013.01)

(58) Field of Classification Search
CPC .......................... H03M 13/11; H03M 13/6575
See application file for complete search history.

(56) References Cited

U.S. PATENT DOCUMENTS

| | | | | |
|---|---|---|---|---|
| 11,483,879 | B2 * | 10/2022 | Humblet | H04W 76/10 |
| 2005/0160350 | A1 * | 7/2005 | Dror | H03M 13/2942 |
| | | | | 714/800 |
| 2020/0294179 | A1 * | 9/2020 | Ray | G06F 12/0842 |
| 2021/0224156 | A1 * | 7/2021 | Cho | G06F 11/1076 |
| 2024/0168873 | A1 * | 5/2024 | Fuller | G11C 11/4082 |

OTHER PUBLICATIONS

Silva, "An Extensible Code for Correcting Multiple Cell Upset in Memory Arrays", Jul. 6, 2018, Journal of Electronic Testing, vol. 34, issue 4.*
An Extensible Code for Correcting Multiple Cell Upset in Memory Arrays (Year: 2018).*

(Continued)

*Primary Examiner* — Guerrier Merant
*Assistant Examiner* — Jack Kensington Barnett
(74) *Attorney, Agent, or Firm* — Morgan, Lewis & Bockius LLP

(57)                ABSTRACT

This application is directed to protecting a data item by storing data bits with integrity bits. The data bits are assigned into a second number of data sets. Data bits of each data set are combined to determine a third number of respective coding bits based on a respective coding pattern. The integrity bits include a set of single-bit error correcting (SEC) code bits and a set of parity bits. Each SEC code bit is a combination of a respective bit of the third number of respective coding bits of each of the second number of data sets, and each parity bit is a combination of a respective subset of SEC code bits and data bits in a respective one of the second number of data sets. These integrity bits are stored with the first number of data bits in a memory for protecting the data item.

20 Claims, 16 Drawing Sheets

1100

(56)               References Cited

OTHER PUBLICATIONS

Cobham Gaisler AB, International Search Report and Written Opinion, PCT/SE2021/050668, Mar. 10, 2022, 17 pgs.
Cobham Gaisler AB, International Preliminary Report on Patentability, PCT/SE2021/050668, Dec. 14, 2023, 13 pgs.
Silva Felipe et al., "An Extensible Code for Correcting Multiple Cell Upset in Memory Arrays," Journal of Electronic Testing, Jul. 6, 2018, 17 pgs.

* cited by examiner

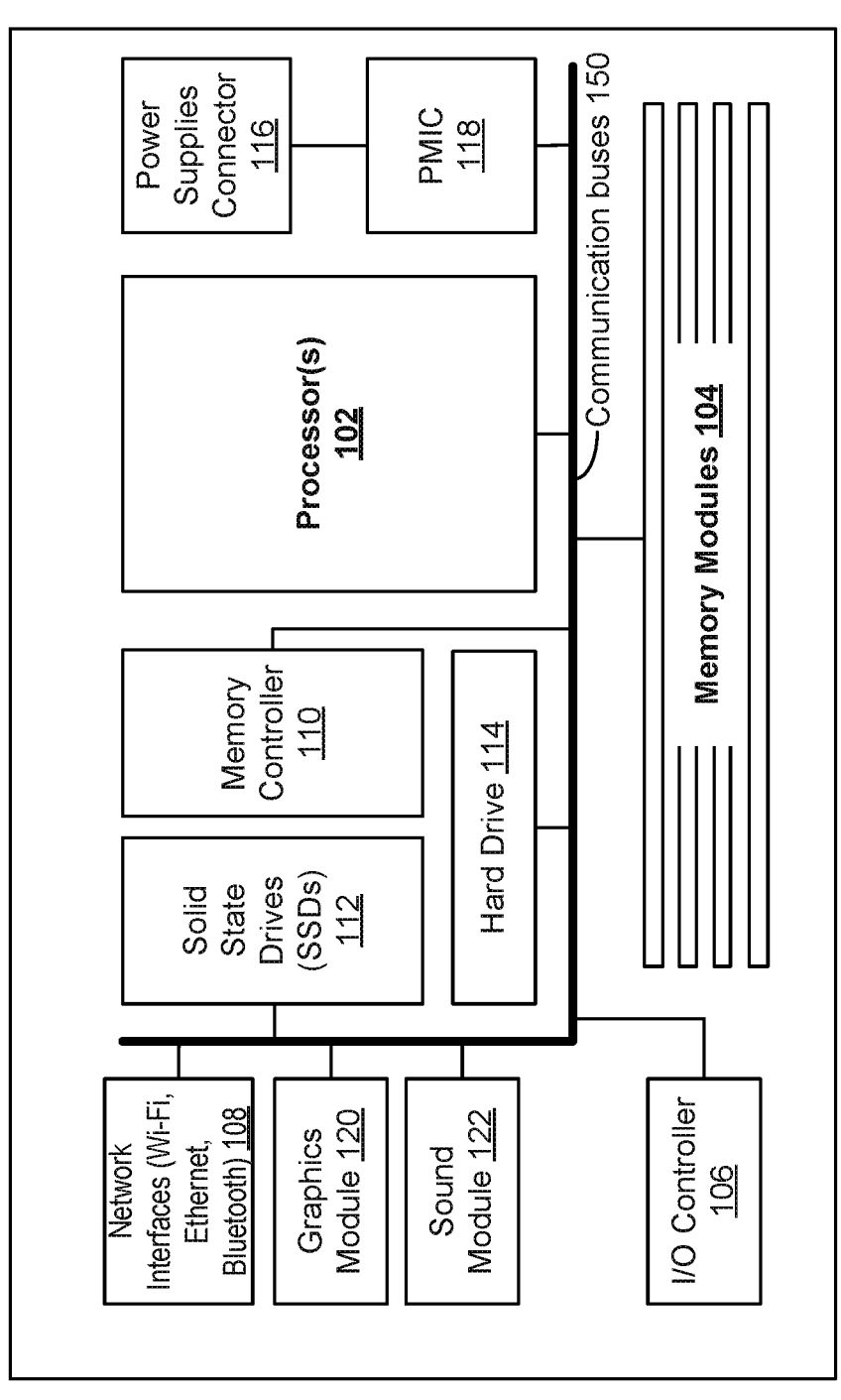
Figure 1

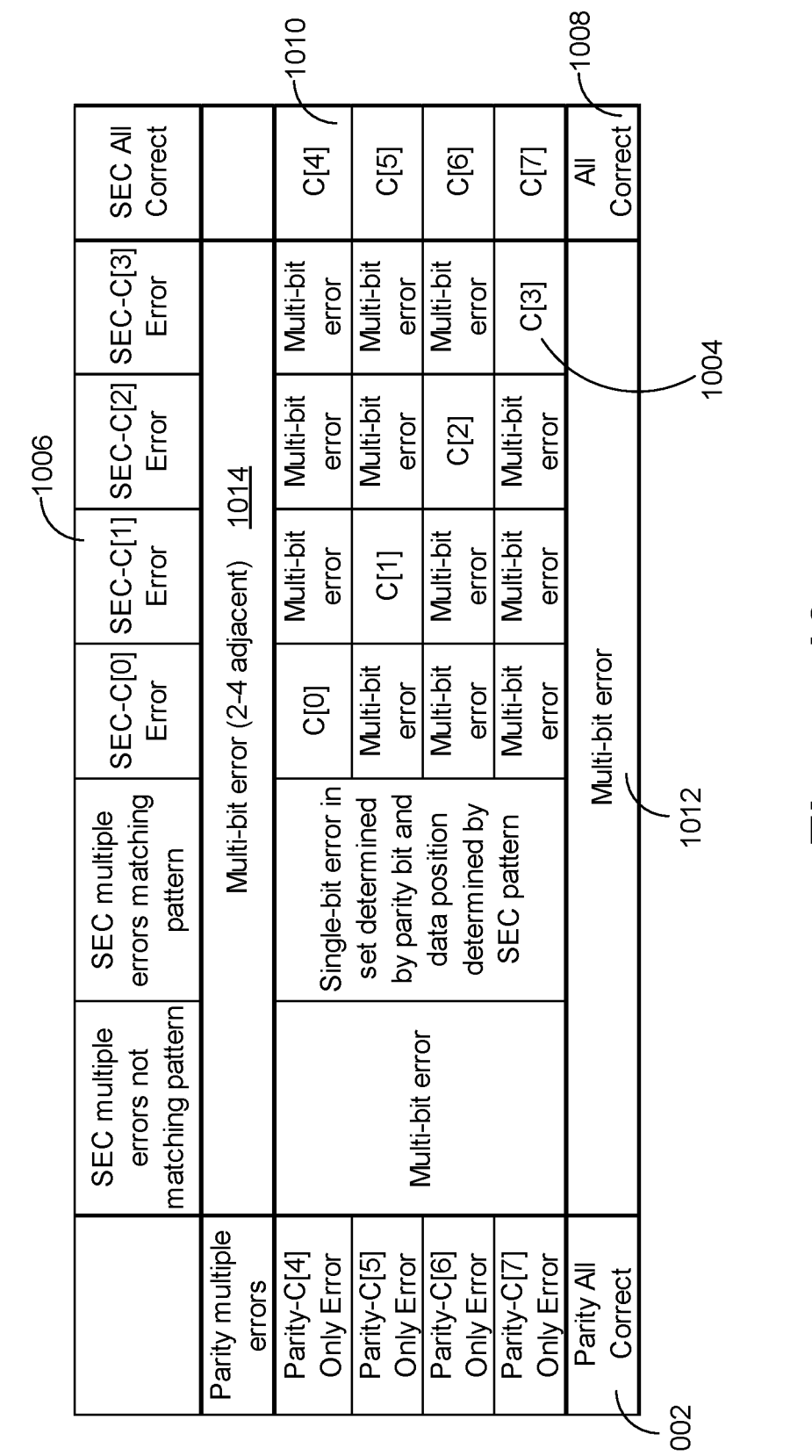

| | SEC multiple errors not matching pattern | SEC multiple errors matching pattern | SEC-C[0] Error | SEC-C[1] Error | SEC-C[2] Error | SEC-C[3] Error | SEC All Correct |
|---|---|---|---|---|---|---|---|
| Parity multiple errors | | Multi-bit error (2-4 adjacent) 1014 | | | | | |
| Parity-C[4] Only Error | Multi-bit error | Single-bit error in set determined by parity bit and data position determined by SEC pattern | C[0] | Multi-bit error | Multi-bit error | Multi-bit error | C[4] |
| Parity-C[5] Only Error | | | Multi-bit error | C[1] | Multi-bit error | Multi-bit error | C[5] |
| Parity-C[6] Only Error | | | Multi-bit error | Multi-bit error | C[2] | Multi-bit error | C[6] |
| Parity-C[7] Only Error | | | Multi-bit error | Multi-bit error | Multi-bit error | C[3] | C[7] |
| Parity All Correct | | Multi-bit error | | | | | All Correct |

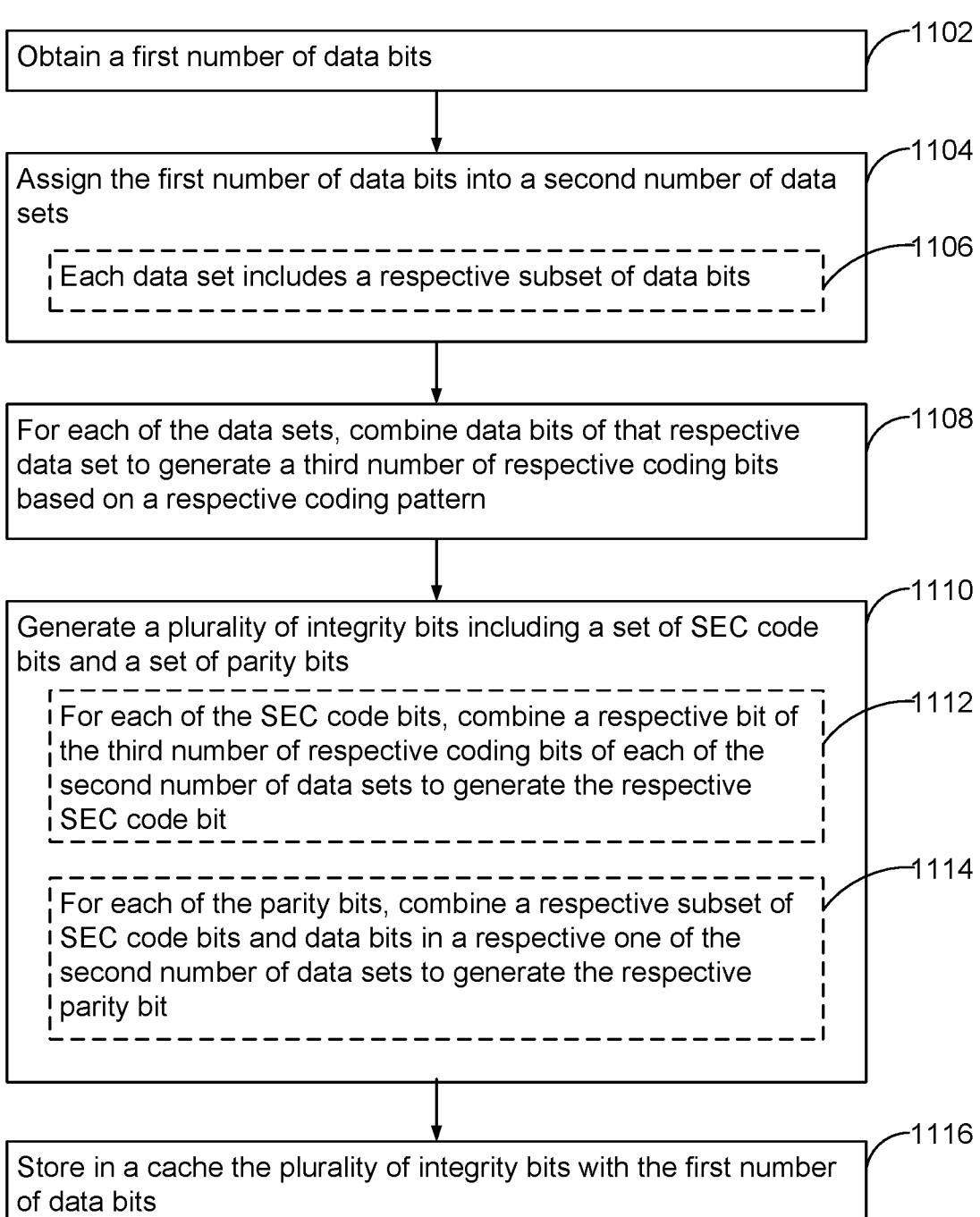

Obtain a first number of data bits ⌐1102

Assign the first number of data bits into a second number of data sets ⌐1104

Each data set includes a respective subset of data bits ⌐1106

For each of the data sets, combine data bits of that respective data set to generate a third number of respective coding bits based on a respective coding pattern ⌐1108

Generate a plurality of integrity bits including a set of SEC code bits and a set of parity bits ⌐1110

For each of the SEC code bits, combine a respective bit of the third number of respective coding bits of each of the second number of data sets to generate the respective SEC code bit ⌐1112

For each of the parity bits, combine a respective subset of SEC code bits and data bits in a respective one of the second number of data sets to generate the respective parity bit ⌐1114

Store in a cache the plurality of integrity bits with the first number of data bits ⌐1116

Figure 11

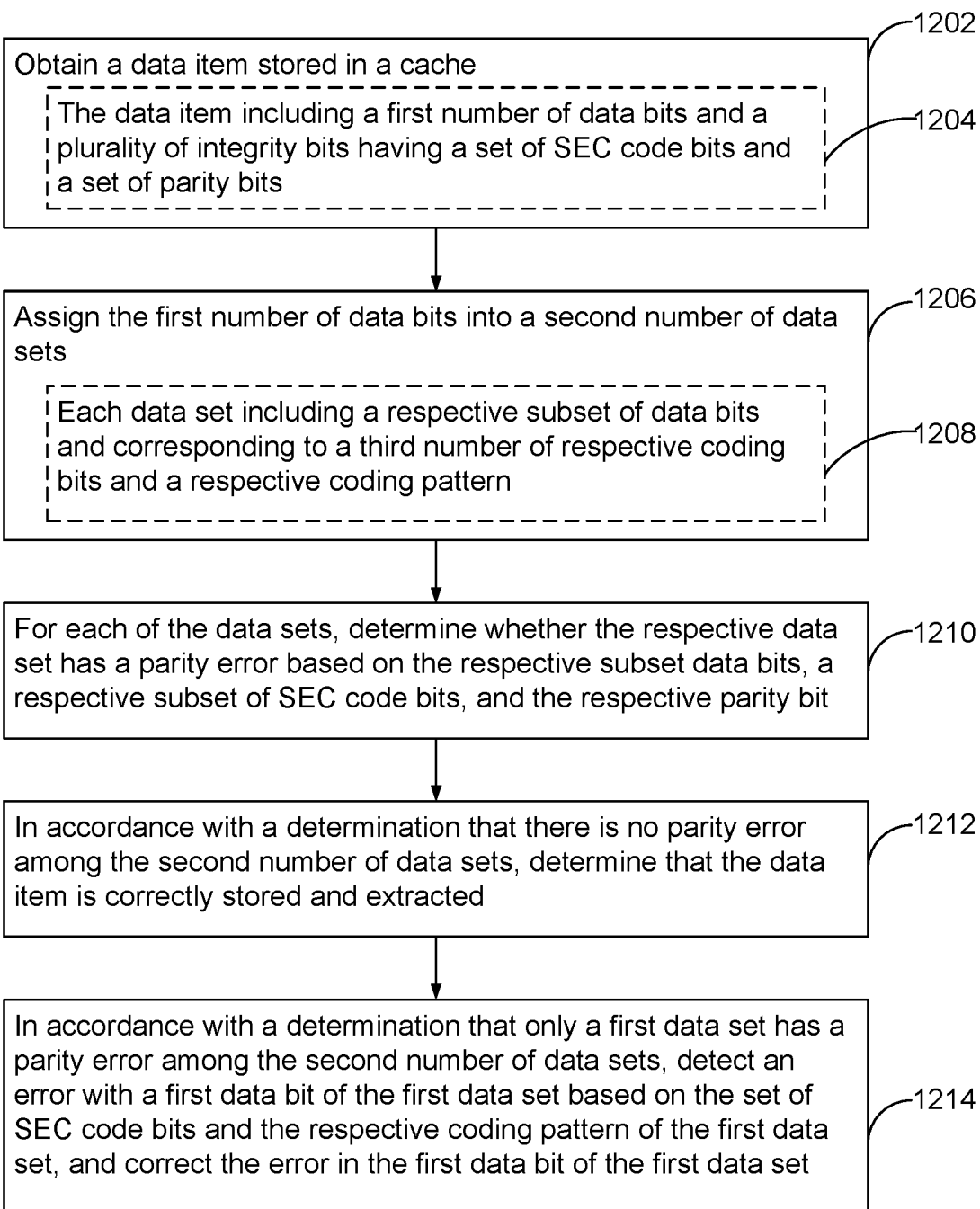

_1200_

Obtain a data item stored in a cache ⌐1202

The data item including a first number of data bits and a plurality of integrity bits having a set of SEC code bits and a set of parity bits ⌐1204

Assign the first number of data bits into a second number of data sets ⌐1206

Each data set including a respective subset of data bits and corresponding to a third number of respective coding bits and a respective coding pattern ⌐1208

For each of the data sets, determine whether the respective data set has a parity error based on the respective subset data bits, a respective subset of SEC code bits, and the respective parity bit ⌐1210

In accordance with a determination that there is no parity error among the second number of data sets, determine that the data item is correctly stored and extracted ⌐1212

In accordance with a determination that only a first data set has a parity error among the second number of data sets, detect an error with a first data bit of the first data set based on the set of SEC code bits and the respective coding pattern of the first data set, and correct the error in the first data bit of the first data set ⌐1214

DATA VALIDATION AND CORRECTION USING HYBRID PARITY AND ERROR CORRECTING CODES

RELATED APPLICATION

This application is a continuation of, and claims priority to, PCT Patent Application No. PCT/SE2021/050668, titled "Data Validation and Correction using Hybrid Parity and Error Correcting Codes," filed Jul. 2, 2021, which is incorporated by reference in its entirety.

TECHNICAL FIELD

This application relates generally to data authentication technology including, but not limited to, methods, systems, and devices for validating and correcting data using a combination of parity check codes and error correcting codes.

BACKGROUND

Information or data held in a memory (e.g., a level-1 cache) of a microprocessor can experience errors caused by external factors, such as environmental radiation. Typically, duplicate data are stored in a lower-level cache or external memory and reloaded into the cache to correct faulty data or errors in the cache. However, the duplicate data requires an extended time to be reloaded, which unavoidably delays ongoing computational tasks of the microprocessor. As such, it would be highly desirable to provide an efficient mechanism to detect and correct data errors that occur within memory (e.g., a cache) of a microprocessor.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of some implementations are used to identify and correct errors in data stored in a cache of a microprocessor, thereby protecting the data stored in the cache from intentional or unintentional tampering. Specifically, a data item is associated with a unique coding pattern that is used for error detection and correction. The data item has a first number of bits and is assigned into a plurality of data sets. Integrity data are generated based on the data sets and includes a set of single-bit error correcting (SEC) bits and a set of parity bits. The SEC and parity bits are applied jointly to quickly identify errors in the data sets, determine whether the errors could be corrected, and corrects erroneous bits (e.g., a single-bit error bit) in the data sets.

In one aspect, a method is implemented by an electronic device for protecting data to be stored. The method includes obtaining a first number of data bits and assigning the first number of data bits into a second number of data sets. Each data set corresponds to a third number of respective coding bits and a respective coding pattern, e.g., for providing a unique combination of at least two of the respective coding bits for each data bit in the respective data set. The method further includes for each data set, combining the respective data bits to determine the third number of respective coding bits based on the respective coding pattern. The method further includes generating a plurality of integrity bits including a set of SEC code bits and a set of parity bits by for each SEC code bit, combining a respective bit of the third number of respective coding bits of each of the second number of data sets and for each parity bit and combining a respective subset of SEC code bits and data bits in a respective one of the second number of data sets. The method further includes storing in a memory the plurality of integrity bits with the first number of data bits.

In another aspect, a method is implemented by an electronic device to detect or correct data errors during data extraction. The method includes obtaining a data item stored in a memory, and the data item includes a first number of data bits and a plurality of integrity bits having a set of SEC code bits and a set of parity bits. The method further includes assigning the first number of data bits into a second number of data sets. Each data set corresponds to a third number of respective coding bits and a respective coding pattern. The method further includes for each data set, determining whether the respective data set has a parity error based on respective data bits, a respective subset of SEC code bits, and a respective parity bit. The method further includes in accordance with a determination that there is no parity error among the second number of data sets, determining that the data item is correctly stored and extracted. The method further includes in accordance with a determination that only a first data set has a parity error among the second number of data sets, detecting an error with a first data bit of the first data set based on the set of SEC code bits and the respective coding pattern of the first data set, and correcting the error in the first data bit of the first data set.

In another aspect, some implementations include an electronic device including one or more processors and memory having instructions stored thereon, which when executed by the one or more processors cause the processors to perform any of the above methods.

In yet another aspect, some implementations include a non-transitory computer-readable medium, having instructions stored thereon, which when executed by one or more processors cause the processors to perform any of the above methods.

Other implementations and advantages may be apparent to those skilled in the art in light of the descriptions and drawings in this specification.

BRIEF DESCRIPTION OF THE DRAWINGS

For a better understanding of the various described implementations, reference should be made to the Detailed Description below.

FIG. 1 is a block diagram of an example system module in a typical electronic device, in accordance with some embodiments.

3

Figures 5A, 5B:
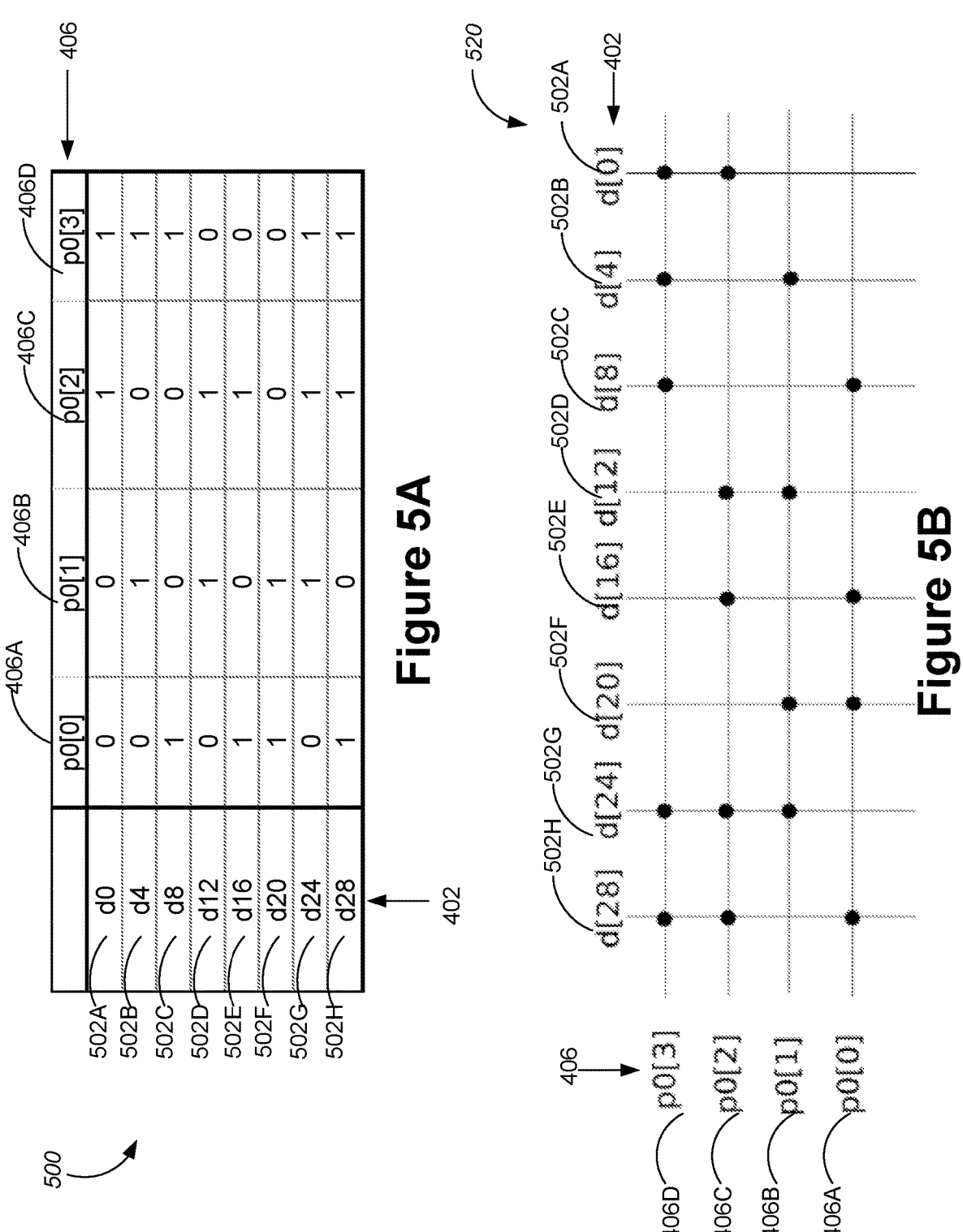
FIG. 5A is a first coding pattern configured to uniquely represent a plurality of data bits of a data set with a number of coding bits, in accordance with some embodiments.

FIG. 5B is a logic diagram of multi-input XOR logics configured to combine a plurality of data bits of a data set to a number of coding bits according to the first coding pattern shown in FIG. 5A, in accordance with some embodiments.

Figures 5C, 5D:
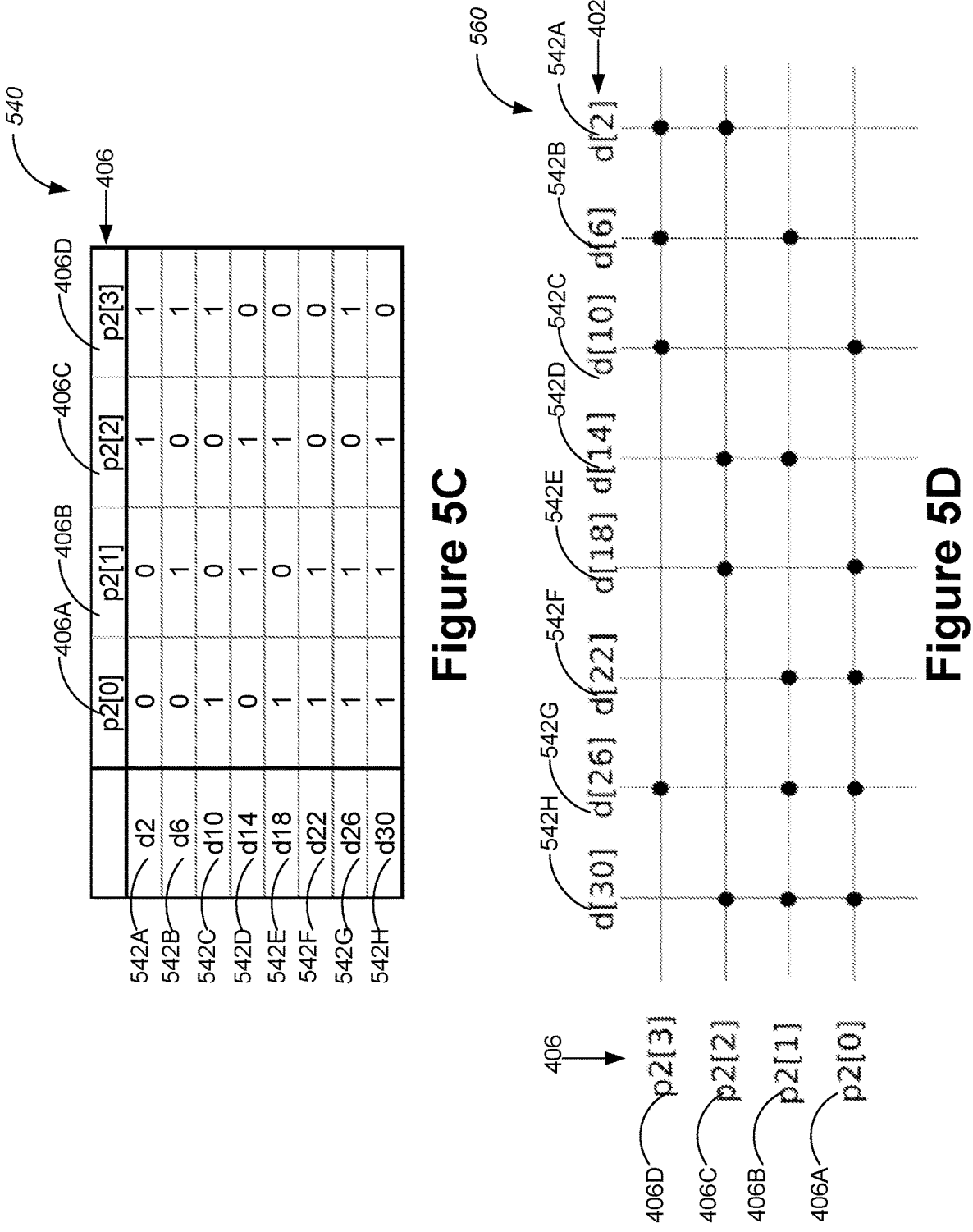

FIG. 5C is a second coding pattern configured to uniquely represent a plurality of data bits of a data set with a number of coding bits, in accordance with some embodiments, and FIG. 5D is a logic diagram of second multi-input XOR logics configured to combine a plurality of data bits of a data set to a number of coding bits according to the second coding pattern shown in FIG. 5C, in accordance with some embodiments.

Figure 6:
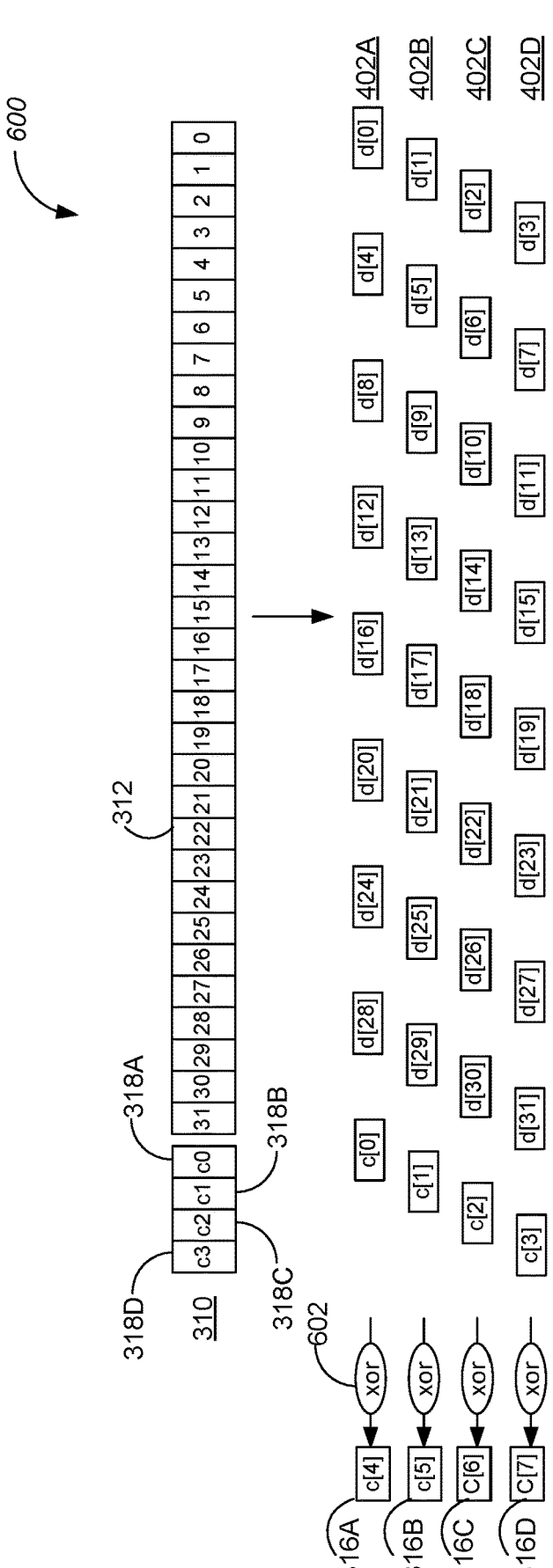

FIG. 6 is a process of generating parity bits from data bits of an integrated data item, in accordance with some embodiments.

Figure 7:
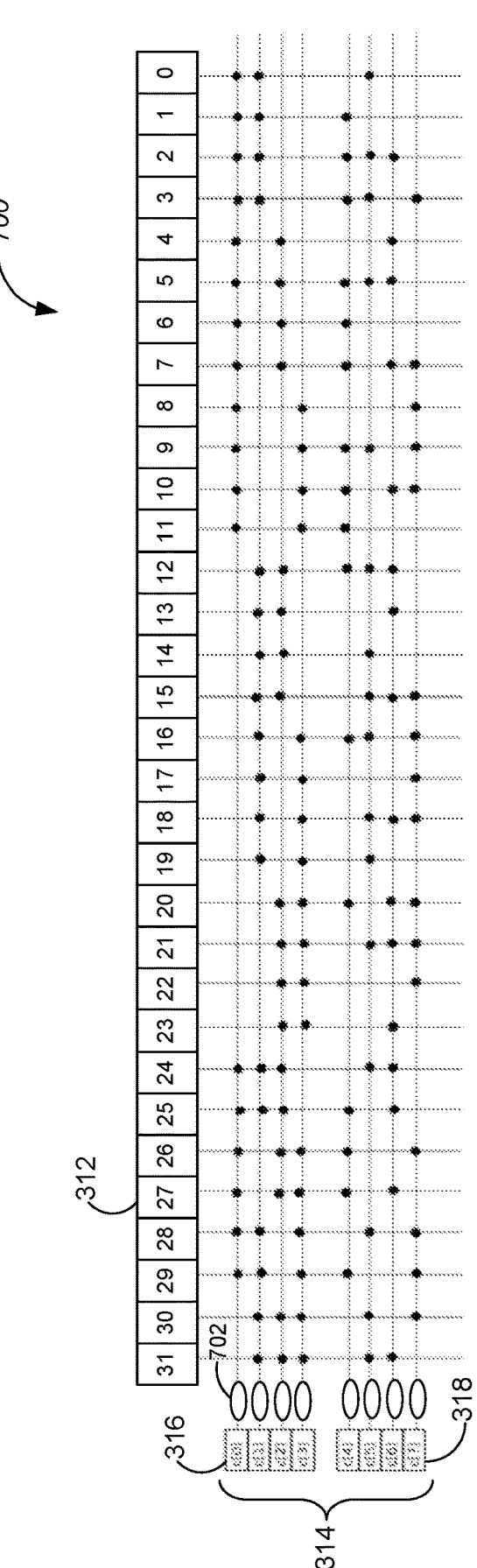

FIG. 7 is a comprehensive logic diagram of equivalent XOR logics configured to combine a plurality of data bits to associated integrity bits, in accordance with some embodiments.

Figure 8:
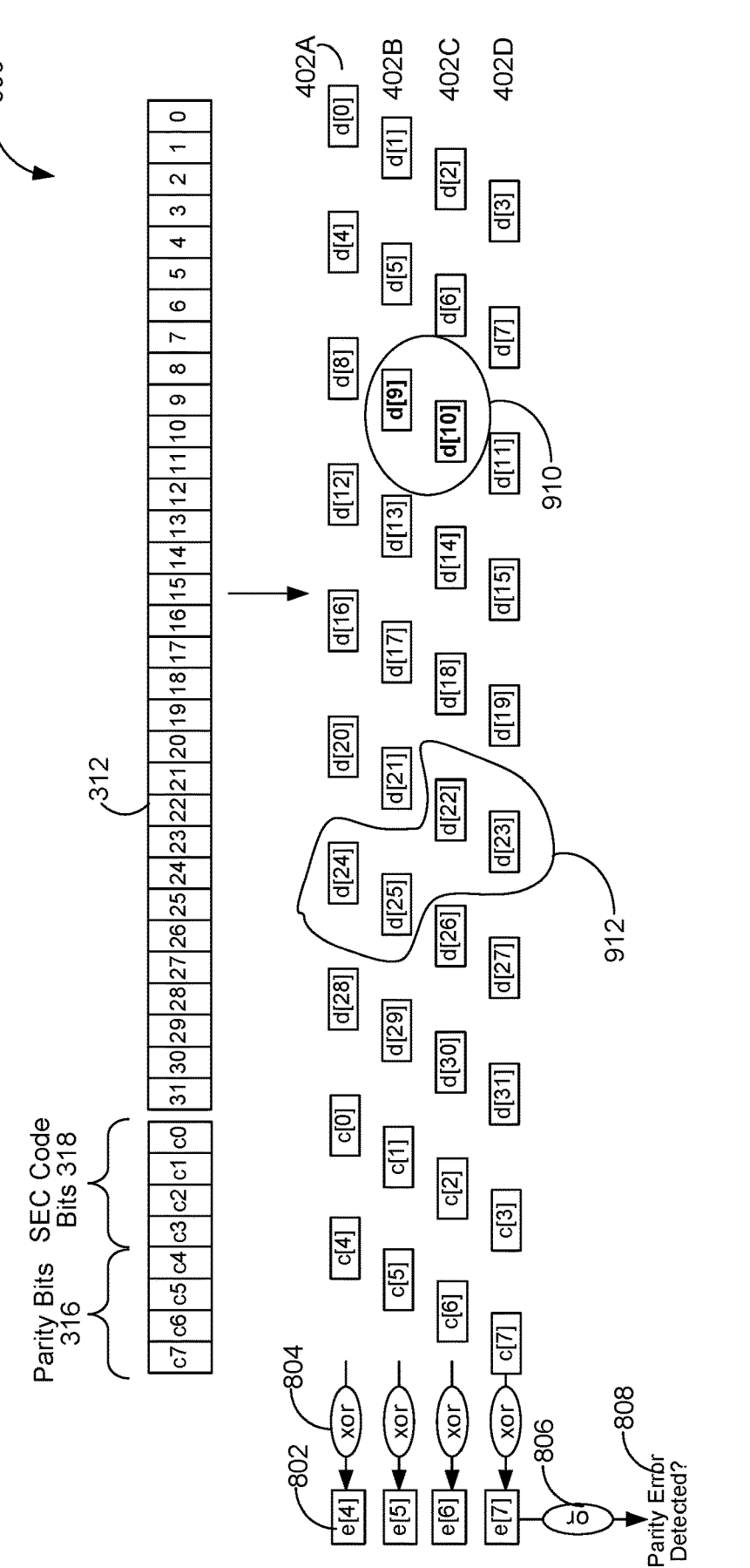

FIG. 8 is a decoding process to detect a parity error in an integrated data item extracted from a memory, in accordance with some embodiments.

Figure 9:
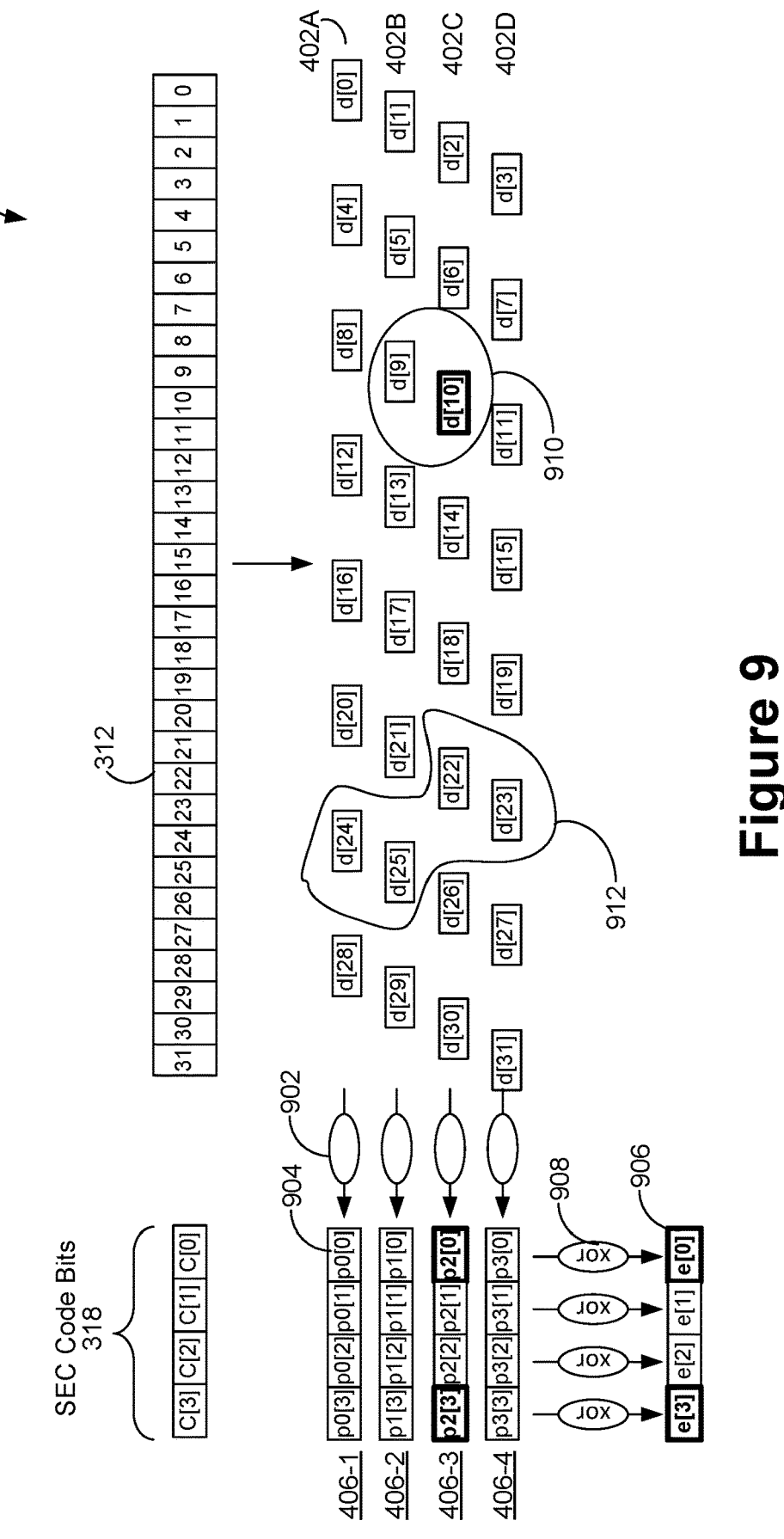

FIG. 9 is a decoding process to detect a single-bit error in an integrated data item extracted from a memory, in accordance with some embodiments.

FIG. 10 is a table summarizing different types of data errors detected during a decoding process, in accordance with some embodiments.

FIG. 11 is a flowchart of a method implemented by a processor for protecting data, in accordance with some embodiments.

FIG. 12 is a flowchart of a method implemented by a processor to decoding data, in accordance with some embodiments.

Figure 13A:
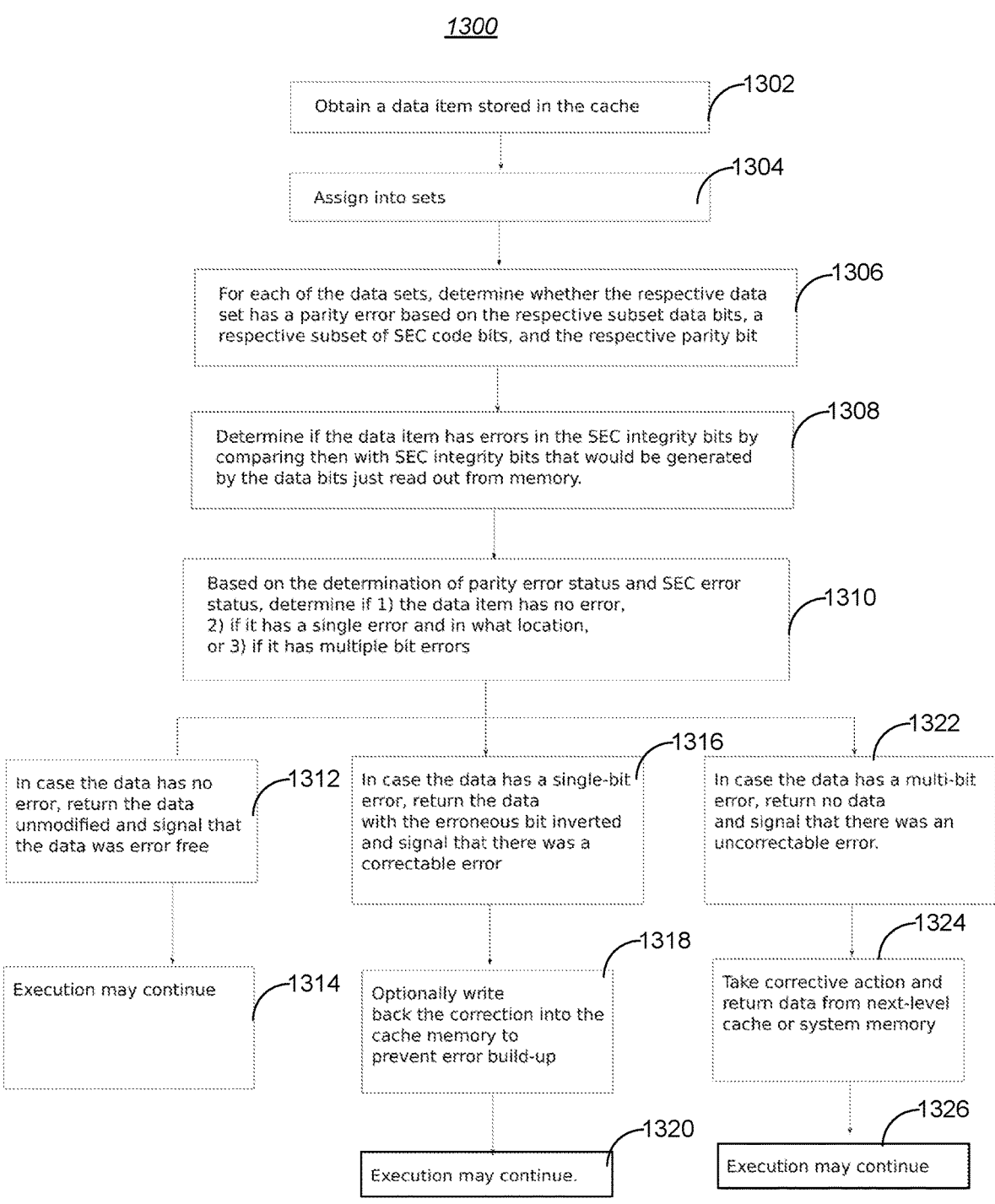

FIG. 13A is a flowchart of a comprehensive method implemented by a processor to decoding data using both parity check and SEC bit check, in accordance with some embodiments.

Figure 13B:
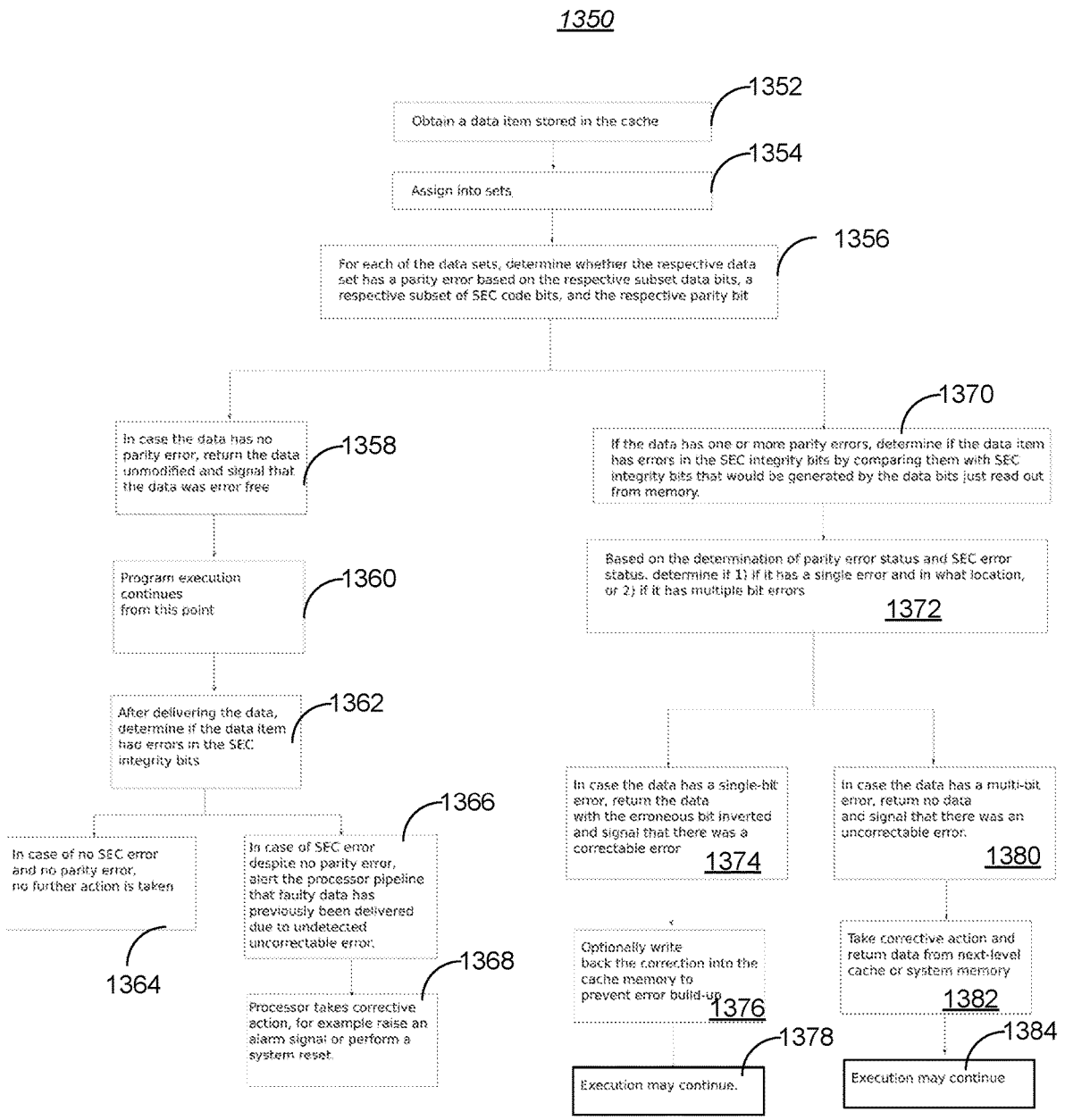

FIG. 13B is a flowchart of a simplified method implemented by a processor to decoding data using both parity check and SEC bit check, in accordance with some embodiments.

Like reference numerals refer to corresponding parts throughout the drawings.

DESCRIPTION OF EMBODIMENTS

Various implementations of this application are directed to storing data items with integrity data to facilitate error detection and/or correction. These data items are stored in a memory (e.g., a level-1 cache) of a microprocessor or other computer devices, which can experience errors caused by external factors, such as radiation or other intentional tampering attempts. Each data item stored in the memory with integrity data including a set of single-bit error correcting (SEC) code bits and a set of parity bits. Specifically, each data item includes a first number of bits and is assigned into a second number of data sets. The SEC code bits are generated based on unique combinations of data bits in each data set, while the parity bits are generated based on the data bits of each data set and a subset of the SEC code bits. As such, the SEC code bits or parity bits are used to determine whether there is any error in the data item and correct single bit data errors in the data item. When a data item is extracted from the memory with its integrity bits, each parity bit is used to determine whether there is any error in the respective data set and a subset of corresponding SEC code bits. If needed, the SEC code bits and parity bits are used to correct single bit data errors based on the unique combinations used to generate the SEC code bits.

FIG. 1 is a block diagram of an example system module 100 in a typical electronic device in accordance with some implementations. System module 100 in this electronic device includes at least one or more processors 102, memory modules 104 for storing programs, instructions and data, an input/output (I/O) controller 106, one or more communication interfaces such as network interfaces 108, and one or more communication buses 150 for interconnecting these components. In some implementations, I/O controller 106 allows the one or more processors 102 to communicate with an I/O device (e.g., a keyboard, a mouse or a track-pad) via a universal serial bus interface. In some implementations, network interfaces 108 includes one or more interfaces for Wi-Fi, Ethernet and Bluetooth networks, each allowing the electronic device to exchange data with an external source, e.g., a server or another electronic device. In some implementations, communication buses 150 include circuitry (sometimes called a chipset) that interconnects and controls communications among various system components included in system module 100.

In some implementations, memory modules 104 include high-speed random access memory, such as DRAM, SRAM, DDR RAM or other random access solid state memory devices. In some implementations, memory modules 104 include non-volatile memory, such as one or more magnetic disk storage devices, optical disk storage devices, flash memory devices, or other non-volatile solid state storage devices. In some implementations, memory modules 104, or alternatively the non-volatile memory device(s) within memory modules 104, include a non-transitory computer readable storage medium. In some implementations, memory slots are reserved on system module 100 for receiving memory modules 104. Once inserted into the memory slots, memory modules 104 are integrated into system module 100.

In some implementations, system module 100 further includes one or more components selected from:
  a memory controller 110 that controls communication between the one or more processors 102 and memory components, including memory modules 104, in electronic device;
  solid state drives (SSDs) 112 that apply integrated circuit assemblies to store data in the electronic device, and in many implementations, are based on NAND or NOR memory configurations;
  a hard drive 114 that is a conventional data storage device used for storing and retrieving digital information based on electromechanical magnetic disks;
  a power supply connector 116 that is electrically coupled to receive an external power supply;
  power management integrated circuit (PMIC) 118 that modulates the received external power supply to other desired DC voltage levels, e.g., 5V, 3.3V or 1.8V, as required by various components or circuits (e.g., the one or more processors 102) within electronic device;
  a graphics module 120 that generates a feed of output images to one or more display devices according to their desirable image/video formats; and
  a sound module 122 that facilitates the input and output of audio signals to and from the electronic device under control of computer programs.

It is noted that communication buses 150 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

In some implementations, the one or more processors 102 are implemented on an integrated circuit (e.g., a system on a chip (SoC)) that integrates one or more microprocessors or central processing units, memory, input/output ports and secondary storage on a single substrate. The one or more processors 102 are configured to receive one or more internal supply voltages provided by PMIC 118. In some implementations, both the processor(s) 102 and PMIC 118 are mounted on a main logic board, e.g., on two distinct areas of the main logic board, and electrically coupled to each other via conductive wires formed in the main logic board.

Figure 2A:
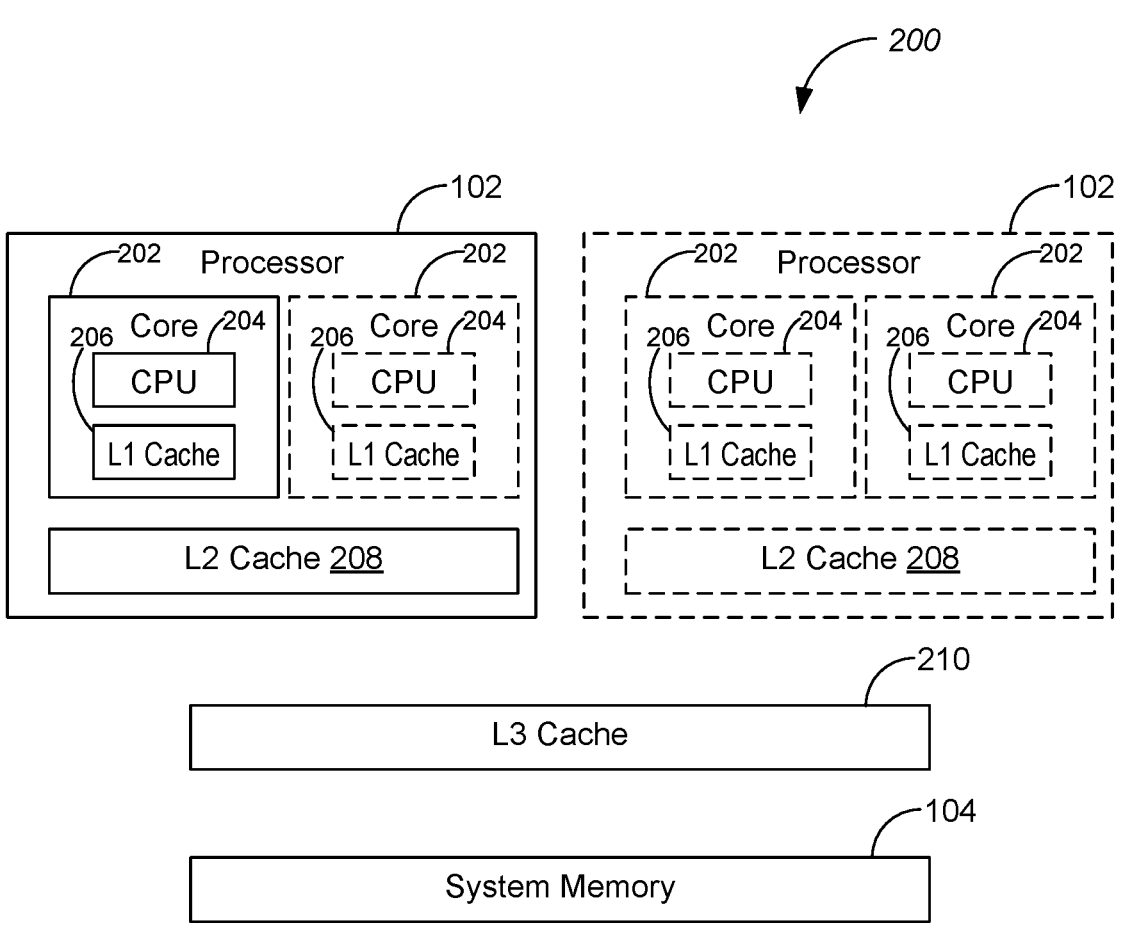
FIG. 2A is a block diagram of a cache structure of a processor system, in accordance with some embodiments.
Figure 2B:
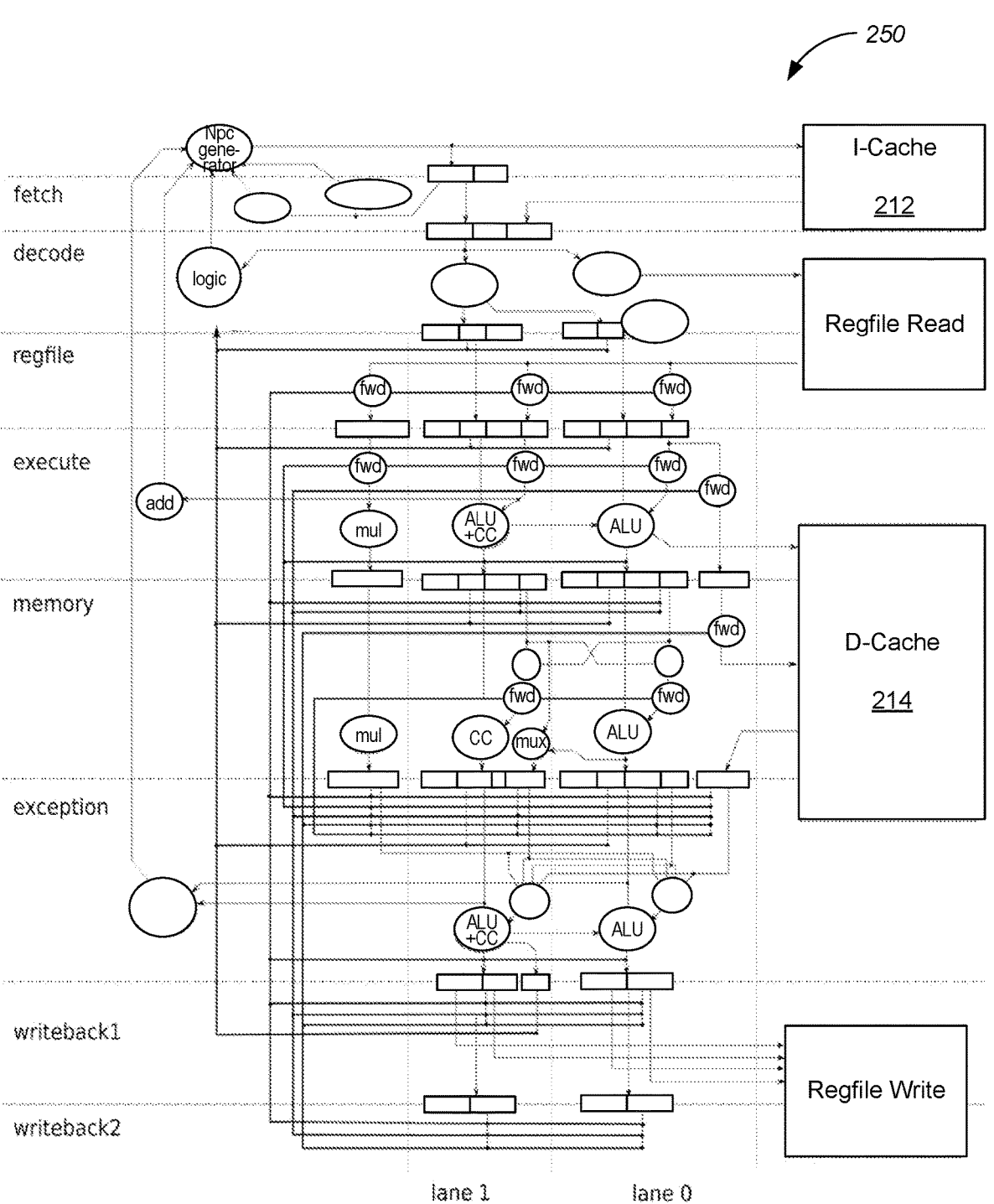
FIG. 2B is a block diagram of a processor pipeline of a processor system having a level-1 cache, in accordance with some embodiments.

FIG. 2A is a block diagram of a cache structure of a processor system 200, in accordance with some embodiments, and FIG. 2B is a block diagram of a processor pipeline 250 of a processor system 200 having a level-1 (L1) cache, in accordance with some embodiments. The processor system 200 includes one or more processors 102, and each processor 102 includes one or more processor cores 202. Each processor core 202 has a central processing unit (CPU) 204 and a respective core cache 206. In some situations, a processor 102 includes two or more processor cores 202, these processor cores 202 share a processor cache 208 with one another. In some embodiments, the processor system 200 includes two or more processors 102 and a system cache 210 that is external to and shared by each processor 102. The caches 206, 208, and 210 are arranged into a hierarchy of caches in the cache structure of the processor system 200, and accessed according to a pre-defined order when these caches operate to store and provide instruction and data to the processor(s) 102. For example, the hierarchy of caches includes three levels that are distinguished based on their distinct operational speeds and sizes. For the purposes of this application, a reference to "the speed" of a memory (including a cache memory) relates to the time required to write data to or read data from the memory (e.g., a faster memory has shorter write and/or read times than a slower memory), and a reference to "the size" of a memory relates to the storage capacity of the memory (e.g., a smaller memory provides less storage space than a larger memory).

In some embodiments, the core cache 206, processor cache 208, and system cache 210 correspond to a first level (L1) cache, a second level (L2) cache, and a third level (L3) cache, respectively. Each core cache 206 holds instructions and data to be executed directly by a respective CPU 204, and has the fastest operational speed and smallest size among the three levels of caches. For each processor 102, the processor cache 208 is slower operationally than the core cache 206 and bigger in size, and holds data that is less likely to be accessed by the CPU(s) 204 of the processor 102 than the data stored in the core cache 206. The system cache 210 is shared by the one or more processors 102, and bigger in size and slower in speed than each core cache 206 and processor cache 208. Data held in the system cache 210 is less likely to be accessed by the processor(s) 102 of the processing cluster(s) than the data stored in the core cache 206 or the processor cache 208. In some embodiments, only if the instructions and data requested by the CPU 102 cannot be found in the caches 206-210, the data is fetched from a system memory 104 via the cache structure of the processor system 200.

Referring to FIG. 2B, the core cache 206 includes an instruction cache 212 and a data cache 214 and stores instructions and data separately. The instruction cache 212 is configured to service instruction fetch requests for program codes. The data cache 214 is configured to service data load and store requests. The processor pipeline 250 of each processor core 202 is configured to fetch instructions from the instruction cache 212 and load and store data into the data cache 214 of the core cache 206 (i.e., the level-1 (L1) cache), allowing instructions of the program executing on the CPU 102 to flow through the processor pipeline 250 without interruptions or stalls. When the instructions and data to be executed are stored in the processor cache 208, they are fetched from the processor cache 208 to the core cache 206. However, when the instructions and data are not stored in the processor cache 208, they are fetched from the system cache 210 to the processor cache 208 then to the core cache 206 in response to a corresponding prefetch request. In some situations, the instructions and data are not stored in both the processor cache 208 and the system cache 210, they need to be loaded from the system memory 104 via the communication buses 150. The system memory 104 is much slower than the caches 206-210 that are on or close to the CPU 204.

The processor pipeline 250 executes the instructions of the program currently running on the core 250. The instructions flow from top to bottom in the diagram of FIG. 2B, with instructions in most cases spending a single clock cycle in each stage. At a final stage each instruction has been fully executed and retires from the pipeline 250. Subsequent instructions that follows the respective instruction are processed by the pipeline 250 before the respective instruction has retired. As such, multiple successive instructions are processed in the pipeline 250 simultaneously, at varying stages of execution. The processor pipeline 250 is a dual issue design in which two instructions are executed in parallel in each stage, allowing the core 202 to execute up to two instructions per cycle. A variety of data forwarding strategies are used to avoid delays when a subsequent instruction depends on the result of an earlier instruction that has not yet completed all stages of the pipeline 250. The instruction cache 212 and data cache 214 must serve requests within one cycle in order to keep up with the pipeline's instruction stream. If a cache miss occurs, all stages of the pipeline 250 are held until a corresponding instruction or data item is recovered from downstream caches 208, 210 or system memory. The pipeline 250 resumes when the missing instruction or data item is fetched from the caches 208 and 210.

Figure 3:
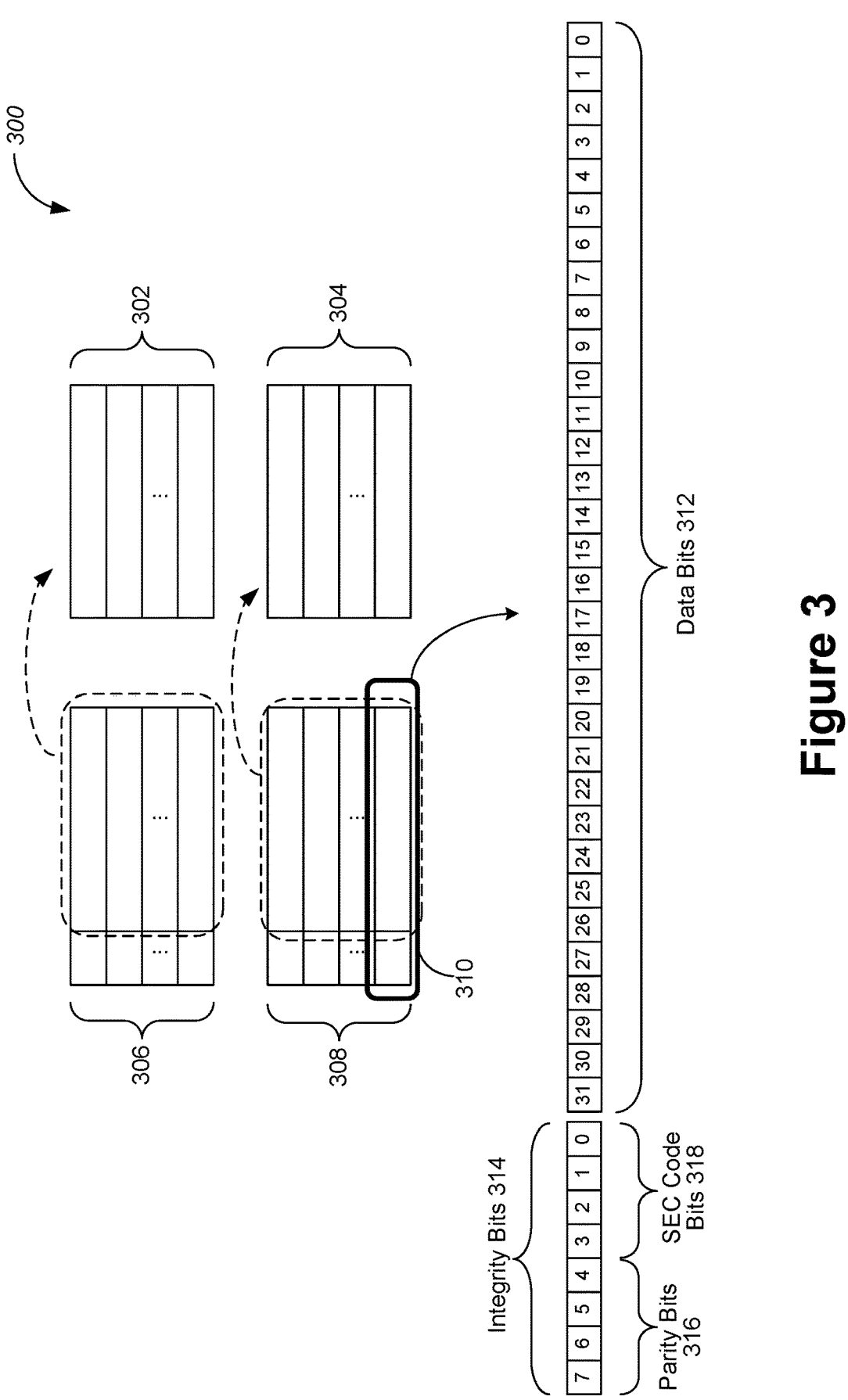
FIG. 3 is a data structure of instructions executed by a processor and related data involved in execution of the instructions, in accordance with some embodiments.

FIG. 3 is a data structure 300 of instructions 302 executed by a processor 102 and related data 304 involved in execution of the instructions 302, in accordance with some embodiments. In some embodiments, a program includes a sequence of instructions 302 stored with related data 304 in a core cache 206. The CPU 204 is configured to extract the sequence of instructions 302 and related data 304 from the instruction cache 212 and data cache 214 of the core cache 206, respectively. The CPU 204 can directly execute the sequence of instructions 302 with the related data 304. Each instruction 302 is stored in a first block 306 of integrated data items in the instruction cache 212 of the core cache 206, and the related data 304 involved in execution of the respective instruction are stored in a second block 308 of integrated data items in the data cache 214 of the core cache 206. Each block 306 or 308 of integrated data items includes a plurality of integrated data items 310 that are physically stored adjacent to one another in the core cache 206, and is accessed in the instruction cache 212 or data cache 214 via respective physical addresses.

Each individual integrated data item 310 includes a first number of data bits 312 and a second number of integrity bits 314. In an example, the integrated data item 310 has 40 bits in total, including 32 data bits 312 and 8 integrity bits 314, and is accessed via a corresponding physical address. The data bits 312 are associated with a respective instruction 302 to be executed or data to be used by the CPU 204. The integrity bits 314 are generated based on the data bits 312 in the same integrated data item 310 and configured to verify whether the data bits 312 are properly stored and extracted from the core cache 206. In some embodiments, an instruction 302 to be executed by the CPU 204 is stored in the first block 306 of integrated data items and is associated with the related data 304 stored in the second block 308 of integrated data items. After each and every integrated data item 310 in the first and second blocks 308 and 312 is verified based on the respective integrity bits 314, the respective data bits 312 are integrated to recover the instruction 302 to be executed and the related data 310 to be applied to execute the instruction 302.

The integrity bits 314 of each integrated data item 310 include a set of parity bits 316 and a set of single-bit error correcting (SEC) code bits 318. The data bits 312 of the respective data item 310 are uniquely coded with a plurality of coding bits based on a data coding pattern, and the plurality of coding bits are combined to generate the set of SEC code bits 318. The data bits 312 and the SEC code bits 318 are combined to generate the set of parity bits 316. The set of parity bits 316 indicate whether there is any data error in the data bits 312 and integrity bits 314, and if there is a data error, the set of SEC code bits 318 indicate whether the data error is fixable and which single bit 312 or 314 is erroneous based on the data coding pattern. Under many circumstances, radiation-induced errors are mainly single bit errors, which can be identified and fixed based on the integrity bits 314. By these means, the CPU 204 fixes most errors directly when the CPU 204 loads the instruction 302 and/or related data 304 from the core cache 206, and does not need to hold its processing thread to await the erroneous instruction or data to be reloaded from a lower level cache or memory (e.g., a processor cache 208).

Additionally, in some embodiments, the instructions 302 are not stored with related data 304 in the core cache 206. Rather, the instructions 302 and related data 304 are stored in and fetched from a processor cache 208 or a system cache 210 according to the data structure 300. Stated another way, each instruction 302 is stored in a first block 306 of integrated data items in the processor cache 208 or system cache 210, and the related data 304 involved in execution of the respective instruction are stored in a second block 308 of integrated data items in the processor cache 208 or system cache 210. Each block of integrated data items includes a plurality of integrated data items 310 that are physically stored adjacent to one another in the processor cache 208 or system cache 210. In accordance with the data structure 300, each individual integrated data item 310 is stored in the processor cache 208 or system cache 210 with a first number of data bits 312 and a second number of integrity bits 314, and the integrity bits 314 include a set of parity bits 316 and a set of SEC code bits 318. During a decoding process, the data bits 312 are extracted from the processor cache 208 or system cache 210 and verified using the associated integrity bits 314.

Figure 4:
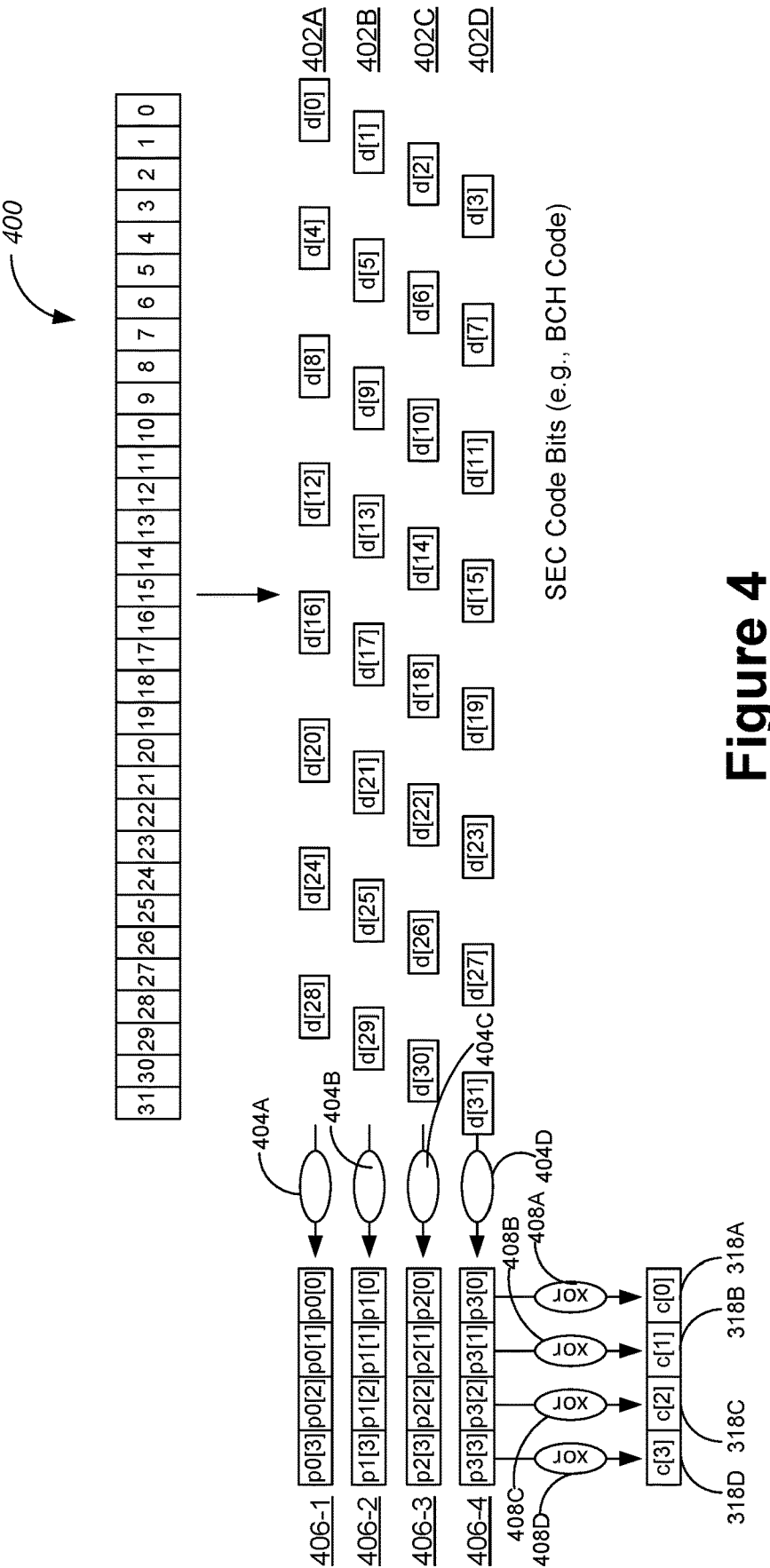
FIG. 4 is a process of generating SEC code bits from data bits of an integrated data item, in accordance with some embodiments.

FIG. 4 is a process 400 of generating SEC code bits 318 from data bits 312 of an integrated data item 310, in accordance with some embodiments. The integrated data item 310 includes a first number of data bits 312 that are part of an instruction 302 to be executed by a CPU 204 or related data 304 used during execution of the instruction 302. The first number of data bits 312 are assigned into a second number of data sets 402. Each data set 402 corresponds to a third number of respective coding bits 406 and a respective coding pattern 404. For each data set 402, data bits 312 of the respective data set 402 are combined to determine the third number of respective coding bits 406 based on the respective coding pattern 404. Stated another way, the respective coding pattern 404 provides a unique combination of at least two of the respective coding bits 406 for each data bit 312 in the respective data set 402. For each SEC code bit 318, a respective bit 406 of the third number of respective coding bits 406 of each of the second number of data sets 402 is combined, i.e., respective bits of the third number of respective coding bits 406 of all of the second number of data sets 402 are combined, to generate the respective SEC code bit 318. In an example, the respective bits of the coding bits 406 of the data sets 402 are combined by a respective multi-input exclusive-or (XOR) logic to obtain each SEC code bit 318.

In this example, the first number is equal to 32, and the integrated data item 310 includes 32 data bits from d[0] to d[31]. The 32 data bits are assigned into 4 data sets 402A-402D, and each data set 402 corresponds to 4 coding bits and a respective coding pattern 404. The second and third numbers are equal to 4. Optionally, as shown in FIG. 4, the 32 data bits are alternatingly assigned to the 4 data sets. A first data set 402A includes data bits d[0], d[4], d[8], d[12], d[16], d[20], d[24], and d[28]; a second data set 402B includes data bits d[1], d[5], d[9], d[13], d[17], d[21], d[25], and d[29]; a third data set 402C includes data bits d[2], d[6], d[10], d[14], d[18], d[22], d[26], and d[30]; and a fourth data set 402D includes data bits d[3], d[7], d[11], d[15], d[19], d[23], d[27], and d[31]. Both a single bit error or an error of adjacent bits can be detected based on this data structure. Alternatively, not shown in FIG. 4, consecutive data bits are assigned to each of the 4 data sets 402A-402D. A first data set 402A includes data bits d[0]-d[7]; a second data set 402B includes data bits d[8]-d[15]; a third data set 402C includes data bits d[16]-d[23]; and a fourth data set 402D includes data bits d[24]-d[31]. A single bit error can be detected based on this data structure, while errors of adjacent bits cannot be detected based on this data structure.

For the first data set 402A, the corresponding 8 data bits are combined (e.g., using a set of XOR-based logics) to determine four respective coding bits p0[0]-p0[3] in a first coding bit set 406-1 based on a first coding pattern 404A. For the second data set 402B, the corresponding 8 data bits are combined (e.g., using a set of XOR-based logics) to determine four respective coding bits p1[0]-p1[3] in a second coding bit set 406-2 based on a second coding pattern 404B. For the third data set 402C, the corresponding 8 data bits are combined (e.g., using a set of XOR-based logics) to determine four respective coding bits p2[0]-p2[3] in a third coding bit set 406-3 based on a third coding pattern 404C. For the fourth data set 402D, the corresponding 8 data bits are combined (e.g., using a set of XOR-based logics) to determine four respective coding bits p3[0]-p3[3] in a fourth coding bit set 406-4 based on a fourth coding pattern 404D. The first bits of the respective coding bits 406 of each data set 402 (i.e., p0[0], p1[0], p2[0], and p3[0]) are combined to get the first SEC code bit 318A, e.g., using an XOR logic 408A. The second bits of the respective coding bits 406 of each data set 402 (i.e., p0[1], p1[1], p2[1], and p3[1]) are combined to get the second SEC code bit 318B, e.g., using an XOR logic 408B. The third bits of the respective coding bits 406 of each data set 402 (i.e., p0[2], p1[2], p2[2], and p3[2]) are combined to get the third SEC code bit 318C, e.g., using an XOR logic 408C. The fourth bits of the respective coding bits 406 of each data set 402 (i.e., p0[3], p1[3], p2[3], and p3[3]) are combined to get the fourth SEC code bit 318D, e.g., using an XOR logic 408D.

In some situations, for each data set 402, the coding pattern 404 is implemented using four respective XOR-based logics 404, and the 8 data bits of the respective data set 402 are combined using the four respective XOR-based logics 404 to determine the four respective coding bits 406. Stated another way, for each data set 402, the coding pattern 404 is implemented using four respective Bose-Chaudhuri-Hocquenghem-based (BCH-based) logics 404, and the 8 data bits of the respective data set 402 are combined using the four respective BCH-based logics 404 to determine the four respective coding bits (also called pseudo-BCH codes in this situation).

In another example not shown in FIG. 4, the 32 data bits of the integrated data item 310 are assigned into 2 data sets, and each data set 402 corresponds to 5 or more coding bits and a respective coding pattern. The second number is equal to 2. The third number is equal to 5 or above, so that each data bit in a respective data set can be coded using a unique combination of at least two of the respective coding bits based on the respective coding pattern. When the third number is equal to 5, the first, second, third, fourth or fifth bits of the respective coding bits 406 of two data sets 402 are combined to get the first, second, third, fourth, or fifth SEC code bit 318, respectively. Specifically, five XOR-based logics are used to generate five coding bits 406 for each of the two data sets, and five additional XOR logic are used to generate five SEC code bits 318 from the coding bits 406.

FIG. 5A is a first coding pattern 500 configured to uniquely represent a plurality of data bits 502 of a data set 402 (e.g., data set 402A) with a number of coding bits 406, in accordance with some embodiments, and FIG. 5B is a logic diagram 520 of multi-input XOR logics configured to combine a plurality of data bits of a data set 402 to a number of coding bits 406 (e.g., coding bits 406-1 in FIG. 4) according to the first coding pattern shown in FIG. 5A, in accordance with some embodiments. In accordance with the first coding pattern 500, each data bit 502 is a unique combination of a distinct subset of coding bits 406. For example, 4 coding bits 406 are applied to code 8 data bits 502 uniquely based on XOR logics. Each of six data bits (i.e., 502A-502F is coded with two of the four coding bits 406, and each of remaining two data bits (i.e., 502G and 502H) is coded with three of the four coding bits 406. Specifically, the first data bit 502A is coded with the first and second coding bits 406C and 406D, and the second data bit 502B is coded with the second and fourth coding bits 406B and 406D. Similarly, each of the data bits 502C-502H are uniquely coded with a respective subset of the coding bits 406A-406D.

Referring to FIG. 5B, known data bits 502 are used to generate the four coding bits 406A-406D according to the first coding pattern 500 during a coding process. Each solid dot connecting a coding bit 406 in a column and a data bit

502 in a row represents an input of a multi-input XOR logic. The first coding bit 406A is generated by a four-input XOR logic receiving four inputs from the data bits 502C, 502E, 502F, and 502H. The second coding bit 406B is generated by a four-input XOR logic receiving four inputs from the data bits 502B, 502D, 502F, and 502G. The third coding bit 406C is generated by a five-input XOR logic receiving four inputs from the data bits 502A, 502D, 502E, 502G, and 502H. The fourth coding bit 406D is generated by a five-input XOR logic receiving four inputs from the data bits 502A, 502B, 502C, 502G, and 502H. By these means, the coding bits 406A-406D are generated from the original data bits 502A-502H and ready to be used as a reference to detect and correct any single bit error in the data bits 502A-502H when the data bits 312 are extracted from a cache.

The above coding pattern 500 can be applied to detect a single bit error within a data set 402 (e.g., which is determined to have the single bit error by a parity check). For example, if the fourth data bit 502D is erroneously flipped when it is being stored within or extracted out of a cache, the four coding bits 406A-406D regenerated from the erroneous fourth data bit 502D will have mismatches with the original coding bits 406A-406D received with the original data bits. The mismatches occur to the second and third coding bits 406B and 406C because of the above coding pattern 500, and will result in SEC check bits generated from the regenerated coding bits 406A-406D different from the SEC code bits 318.

Stated another way, during a decoding process, a processor 102 extracts the data bits 502A-502H with the four coding bits 406A-406D from the cache, and regenerates the four coding bits 406A-406D from the extracted data bits 502A-502H. The regenerated coding bits 406A-406D of this data set 402 (e.g., which is determined to have the single bit error by a parity check) are combined with those of the other three data sets to generate SEC check bits. These SEC check bits are compared with the extracted SEC code bits 318 to find mismatches. If an error occurs in this data set, the processor determines whether mismatches correspond to any of the combinations of the first coding pattern 500 in FIG. 5A. In accordance with a determination that the mismatches of the SEC code and check bits correspond to one of the eight combinations of the first coding pattern 500, a corresponding data bit 502 is identified as an error bit. For example, if the mismatches are found in the second and third coding bits 406B and 406C, then the fourth data bit 502D is identified as an error bit. Conversely, in accordance with a determination that the values of the four coding bits 406A-406D does not correspond to any of the eight combinations of the first coding pattern 500, none of the eight data bits 502A-502H is identified. More details on generating the SEC check bits are discussed below with reference to FIG. 7.

FIG. 5C is a second coding pattern 540 configured to uniquely represent a plurality of data bits 542 of a data set 402 (e.g., data set 402C) with a number of coding bits 406, in accordance with some embodiments, and FIG. 5D is a logic diagram 560 of second multi-input XOR logics configured to combine a plurality of data bits 542 of a data set 402 to a number of coding bits 406 (e.g., coding bits 406-3 in FIG. 4) according to the second coding pattern 540 shown in FIG. 5C, in accordance with some embodiments. In accordance with the second coding pattern 540, each data bit 542 is a unique combination of a distinct subset of coding bits 406. For example, 4 coding bits 406 are applied to code 8 data bits 542 uniquely based on XOR logics. Each of six data bits (i.e., 542A-542F is coded with two of the four coding bits 406, and each of remaining two data bits (i.e., 542G, 542H) is coded with three of the four coding bits 406. Specifically, the first data bit 542A is coded with the third and fourth coding bits 406C and 406D, and the second data bit 542B is coded with the second and fourth coding bits 406B and 406D. Similarly, each of the data bits 542C-542H are uniquely coded with the coding bits 406A-406D.

Referring to FIG. 5D, known data bits 542 are used to generate the four coding bits 406A-406D according to the second coding pattern 540 during a coding process. The coding bits 406A-406D are converted to SEC code bits 318 that are stored with the original data bits 542A-542H and used as a reference to detect and correct any single bit error that could occur to the data bits 542A-542H. Specifically, during a decoding process, a processor 102 extracts the data bits 542A-542H with the four coding bits 406A-406D from the cache, and regenerates the four coding bits 406A-406D from the extracted data bits 542A-542H. The regenerated coding bits 406A-406D of this data set 402 are combined with those of the other three data sets to generate SEC check bits. The regenerated SEC check bits are compared with the extracted SEC code bits 318 to find mismatches. If an error occurs in this data set, the processor determines whether mismatches correspond to any of the combinations of the second coding pattern 540 in FIG. 5C. In accordance with a determination that the mismatches correspond to one of the eight combinations of the first coding pattern 500, a corresponding data bit 542 is identified as an error bit. Conversely, in accordance with a determination that the values of the four coding bits 406A-406D do not correspond to any of the eight combinations of the second coding pattern 540, none of the eight data bits 542A-542H is identified.

In some embodiments, the first number of data bits 312 are assigned into the second number of data sets 402. Each data set 402 has a respective coding pattern 404. In an example, all data sets 402 apply the same coding pattern, e.g., the first coding pattern 500. Alternatively, in another example, the data sets 402 apply two or more different coding patterns. For example, a first data set 402A applies the first coding pattern 500, while a second data set 402B applies the second coding pattern 540. When the corresponding integrated data item 310 is coded, data bits 502 in each data set 402A or 402B are combined according the respective coding pattern 500 or 540 to generate the coding bits 406-1 or 406-2, respectively. The coding bits 406-1 of the data set 402A and the coding bits 406-2 of the data set 402B are further combined (408) one by one to obtain the SEC code bits 318A-318D to be stored with the first number of data bits 312.

FIG. 6 is a process 600 of generating parity bits 316 from data bits 312 of an integrated data item 310, in accordance with some embodiments. The first number of data bits 312 are assigned into a second number of data sets 402. Each data set 402 corresponds to a third number of respective coding bits 406 and a respective coding pattern 404 (e.g., coding patterns 500 and 540 in FIGS. 5A-5D). For each data set 402, data bits 312 of the respective data set 402 are combined to determine the third number of respective coding bits 406 based on the respective coding pattern 404. For each SEC code bit 318, a respective bit of the third number of respective coding bits 406 of each of the second number of data sets 402 is combined to generate the respective SEC code bit 318, i.e., respective bits of the third number of respective coding bits 406 of all of the second number of data sets 402 are combined to generate the respective SEC code bit, for each parity bit 316, a respective subset of SEC code bits 318 and data bits 312 in a respective one of the second number of data sets 402 are combined, e.g., using a multi-input XOR logic 602, to result in the respective parity bit 316.

In this example, the first number is equal to 32, and the integrated data item 310 includes 32 data bits from d[0] to d[31]. The 32 data bits are assigned into 4 data sets, and each data set corresponds to 4 coding bits. The integrated data item 310 corresponds to 4 SEC code bits 318 and 4 parity bits 316. Each parity bit 316 is generated by combining data bits 312 of a respective one of the data sets 402 and a respective SEC code bit 318. Specifically, for a first parity bit 316A, 8 data bits of the first data set 402A and the first SEC code bit 318A are combined (e.g., using an XOR logic 602A) to determine the first parity bit 316A. For a second parity bit 316B, 8 data bits of the second data set 402B and the second SEC code bit 318B are combined (e.g., using an XOR logic 602B) to determine the second parity bit 316B. For a third parity bit 316C, 8 data bits of the third data set 402C and the third SEC code bit 318C are combined (e.g., using an XOR logic 602C) to determine the third parity bit 316C. For a fourth parity bit 316D, 8 data bits of the fourth data set 402D and the fourth SEC code bit 318D are combined (e.g., using an XOR logic 602D) to determine the fourth parity bit 316D.

Alternatively, in another example not shown in FIG. 4, the 32 data bits of the integrated data item 310 are assigned into 2 data sets, and each data set 402 corresponds to 5 or more coding bits and a respective coding pattern. The second number is equal to 2. The third number is equal to 5 or above. When the third number is equal to 5, the SEC code bit 318 has 5 bits. In some embodiments, the parity bits 316 have 3 bits. Two of the parity bits 316 correspond to the 2 data sets 402, respectively. Each of these two parity bits 316 is generated by combining data bits 312 of a respective one of the data sets 402 and a respective subset of the 5 SEC code bit 318. For each of these two parity bits 316, the respective subset of the 5 SEC code bits 318 optionally includes one, two, three, or four SEC code bits 318. The parity bits 316 further have a remaining parity bit 316. In some embodiments, the remaining parity bit 316 is generated by combining a subset of the SEC code bit 318 that may or may not overlap the respective subsets of the SEC code bits 318 corresponding to the other two parity bits 316. Additionally, in some embodiments, the integrated data item 310 includes 24 data bits and 8 integrity bits. The 24 data bits are assigned into 2, 3, 4, or 6 data sets each having 12, 8, 6, or 4 data bits, respectively. The 8 integrity bits includes 2, 3, 4, or 6 parity bits.

FIG. 7 is a comprehensive logic diagram 700 of equivalent XOR logics configured to combine a plurality of data bits 312 to associated integrity bits 314, in accordance with some embodiments. In some embodiments, each SEC code bit 318 is generated by combining a subset of data bits 312 and a subset of coding bits 406 successively using two XOR logics 404 and 408 (FIG. 4), and each parity bit 316 is generated by combining a respective subset of SEC code bits 318 and a subset of data bits 312 using an XOR logic 602 (FIG. 6). As shown in FIG. 7, these successive logic operations can be combined and implemented using one level of XOR logic, thereby generating each of the integrity bits 314 using the data bits 312 directly. Stated another way, each integrity bit 314 is a combination of a distinct subset of the first number of data bits 312, and each of the first number of data bits 312 can be represented as a unique combination of the integrity bits 314.

During a coding process, data bits 312 to be stored in a cache are known, and used to generate the integrity bits 314 according to a comprehensive coding pattern. Each solid dot connecting an integrity bit 314 in a column and a data bit 312 in a row represents an input of a multi-input XOR logic 702. For example, the first integrity bit c[0] (i.e., the first SEC code bit 318A) is generated by an 18-input XOR logic receiving eighteen inputs from the data bits d[0]-d[11] and [d24]-d[29]. In some embodiments, a single stage of multiple input XOR logic (e.g., 18-input XOR logic) is slow, thereby making coding and decoding relatively slow for integrity check. The multi-input XOR logics applied to generate each integrity bit is implemented by two or stages of XOR logics. For example, the first integrity bit c[0] (i.e., the first SEC code bit) is generated by two stages of XOR logics. In some embodiments, referring to FIG. 4, every eight data bits are combined using an eight-input XOR logic in the first stage to output four intermediate data bits (e.g., p0[0], p0[1], p0[2], and p0[3]) that are further combined using a single four-input XOR logic 408. By these means, the integrity bits 314 are generated from the original data bits 312 and ready to be used as a reference to detect and correct any single bit error in the data bits 312 when the data bits 312 are extracted from a cache.

Conversely, during a decoding process, the data bits 312 are extracted with the integrity bits 314. The data bits 312 are combined to regenerate the integrity bits 314 based on the above comprehensive coding pattern. The regenerated integrity bits 314 and the extracted integrity bits 314 are compared to determine mismatches between them. The mismatches of the integrity bits 314 are used to uniquely identify a single bit error in the data bits 312. For example, if the mismatches are detected in integrity bits c[1], c[3], and c[7] and not in any other integrity bits, the single bit error is identified to be located at d[19]. Alternatively, if the mismatches do not correspond to any of the data bits according to the comprehensive data structure, there are two or more erroneous bits in the data bits 312, or one or more of the extracted integrity bits 314 are erroneous.

FIG. 8 is a decoding process 800 to detect a parity error in an integrated data item 310 extracted from a cache (e.g., a core cache 206, a processor cache 208, or a system cache 210), in accordance with some embodiments. The integrated data item 310 includes a first number of data bits 312 and a plurality of integrity bits 314, and the plurality of integrity bits 314 include a set of SEC code bits 318 and a set of parity bits 316. The integrated data items 310 has a predefined data structure known to a processor 102 storing the integrated data item 310 into the cache and extracting the integrated data item 310 from the cache. In an example data structure, the integrated data item 314 has 40 bits including 32 data bits followed by 4 SEC code bits 318 and 4 parity bits 316. During this decoding process, the first number of data bits 312 are assigned to a second number of data sets 402. For each data set 402, the processor 102 determines whether the respective data set has a parity error based on respective data bits, a respective subset of SEC code bits, and a respective parity bit.

In some embodiments, for each data set 402, the respective data bits 312 in the data set 402, respective subset of SEC code bits 318, and respective parity bit 316 are combined to regenerate a parity bit 802 using a respective XOR logic 804. The respective parity bit 316 is an XOR combination of the respective data bits 312 in the data set 402 and respective subset of SEC code bits 318. In an example, 8 data bits 312 and 1 SEC code bit is combined using an XOR logic to generate a parity bit 316. The parity bit 312 has a value to satisfy an even parity check, so does the regenerate parity bit 802. If any single bit of the respective data bits 312 in the data set 402, respective subset of SEC code bits 318, and respective parity bit 316 is erroneous, the regenerated parity bit 802 is equal to "1".

The second number of regenerated parity bits 802 are combined using an OR logic 806 to generate an overall parity error indication bit 808. If there is no parity error among the second number of data sets 402, all parity bits 802 are equal to "0", indicating that no error is found in all of the data sets 402, and determined that the data item 310 is correctly stored and extracted. Conversely, if there is a single parity error among any of the second number of data sets 402, one or more parity bits 802 are equal to "1", so do a combination of the parity bits 802, thereby indicating that there is at least one parity error found in the data sets 402.

It is noted that if one of the data sets 402 has an even number of erroneous data bits 312, the overall parity error indication bit 808 does not indicate any parity error (e.g., is equal to "0"). In the case of two errors occurring in the same data set 402, the SEC bits 906 will still indicate an error and reveal that an error is present in the data word. Since no correct data or single-error case may produce this condition, the decoder can conclude that a multi-bit error has occurred.

Since the coding scheme has a separate parity part 316, it allows for a simplified error check where only a parity check of the parity bits 316 against the SEC bits 318 and data bits 312 are consulted to check for any errors. If no parity error is detected then the data is taken as correct, and in case of a parity error the full correction process using all integrity bits 314 is performed with some additional delay. Such a design approach may be preferred over directly performing a full decode of the integrity bits 314 in certain cases where the amount of logic directly on the memory output is desired to be kept to a minimum and the rate of errors is very low such that most data items will have no errors and can be passed through without delay. The simplified checking approach will not detect a double error in the same data set 402 since the parity check alone is not capable of detecting such a double error. These double errors may still be handled by performing the full SEC check some time after the data has been delivered, and raising a signal to alert the system that incorrect data was previously delivered. An action could be taken by the system on that signal such as stopping or restarting execution, or raising some form of alert to the surrounding system, depending on the system design. The probability of multiple bit errors in the same set 402 occurring from a single error event (such as one radiation impact) can be minimized by selecting the distribution of the bits of the data word 312 and integrity bits 314 into sets 402 so that all bits in the same data set 402, including the SEC bits covered by the same parity bit 802, as well as the parity bit 802 itself, have as much physical distance between them as possible. Provided that all the bits of the data word are stored in a row with even distance and provided that the bit number of the data corresponds to the actual physical location where that individual bit of memory is stored, then alternating the bits into different sets as shown in FIG. 8 provides the optimal distance. In the example of FIG. 8, each bit in a set will be at a distance of four bit positions from any other bit in the same set. With the optimal pattern, any multiple-bit error affecting a number of adjacent bits up to the number of sets 402 can be caught both by the full decode process as well as by the simplified parity check, since such an error can affect at most a single bit in each set 402.

When the erroneous data bits 312 are adjacent to each other, they can be detected using the parity bits 316 and may, sometimes but not always, be detected by the SEC bits. Two adjacent data bits in the same integrated data item 310 are always in two different groups 402A-402D in FIG. 8 and affect two different parity bits 316. The chance of having two or more data erroneous bits in the same integrated data item 310 is extremely low in typical applications. When bit errors occur in an integrated data item 310, it is most probably a single bit error with one of the data bits 312, parity bits 316, and SEC code bits 318 and can be fixed directly. For example, the processor 102 determines that only a first data set (e.g., 402A) has a parity error among the second number of data sets 402, e.g., because only the corresponding regenerated parity bit 802 indicates a parity error. An error is further detected and corrected with a first data bit of the first data set based on the set of SEC code bits 318 and the respective coding pattern of the first data set. By these means, the process 800 provides a fast parity check to detect errors in "hot path" from RAM read data into processor pipeline, at least single errors can be detected with fast check and then corrected on the spot.

FIG. 9 is a decoding process 900 to detect a single-bit error in an integrated data item 310 extracted from a memory (e.g., a core cache 206, a processor cache 208, or a system cache 210), in accordance with some embodiments. The integrated data items 310 has a predefined data structure known to a processor 102 storing the integrated data item 310 into the cache and extracting the integrated data item 310 from the cache. The integrated data item 310 includes a first number of data bits 312. During this decoding process, the first number of data bits 312 are assigned to a second number of data sets 402. Each data set 402 corresponds to a third number of respective coding bits and a respective coding pattern 902 (e.g., pattern 500 or 540 in FIGS. 5A-5D) known to the processor 102. The coding pattern 902 is based on an XOR logic. In some embodiments, for each data set 402, the processor 102 combines the respective data bits 312 of the respective data set 402 to determine the third number of respective coding bits 904 based on the respective coding pattern 902. A set of SEC check bits 906 are generated based on the coding bits 904 of the data sets 402, and specifically, each SEC check bit 906 is a combination of a respective bit of the third number of respective coding bits 904 of each of the second number of data sets 402, e.g., using a respective XOR logic 908. The SEC code bits 318 extracted with the data bits 312 and the SEC check bits 906 regenerated from the data bits 312 are compared to find mismatches.

If a parity check has identified a single bit error in one of the data sets 402, the mismatches are used to identify which bit in the one of the data sets 402 is erroneous based on the coding pattern 902 of the one of the data sets 402. In some situations, if all data bits of four data sets 402 are correct, the parity check in FIG. 8 does not indicate any parity error, and the SEC code bits 318 and the SEC check bits 906 also match. However, if the parity check in FIG. 8 indicated that there is a single bit error, e.g., the third data set 402C, the coding bits p2[0], p2[1], p2[2], and p2[3] are regenerated based on the second coding pattern 540 shown in FIG. 5C and have errors with p2[0] and p2[3], thereby causing errors in the SEC check bits e[0] and e[3]. When the SEC check bits 906 and the SEC code bits 318 are combined or compared, the mismatches are found in p2[0] and p2[3], which indicates that the third bit is erroneous in the data set 402C (i.e., d[10]) has a parity error detected in the decoding process 800. Once detected, this single bit error at d[10] can be corrected directly without requiring d[10] or the integrated data item 310 to be reloaded from a higher level memory.

In some embodiments, the respective XOR logic 908 is applied to generate the set of SEC check bits 906 and compare the SEC code bits 318 and the SEC check bits 906. Each XOR logic 908 combines a respective bit of the third number of respective coding bits 904 of each of the second number of data sets 402 with a respective SEC code bit 318. The bits having a value of "1" indicate mismatching coding bits. A combination of the mismatching coding bits is checked with reference to a coding pattern of a data set 402 having a parity error detected in the decoding process 800, and used to identify a bit in the data set 402 as an error bit. If the error bit is equal to "1", it is corrected to "0". If the error bit is equal to "0", it is corrected to "1". By these means, the processor 102 can correct the erroneous bit directly without reloading the corresponding instruction or data from a lower level cache or memory module.

In some embodiments, the same data set 402 includes two error bits that cannot be detected by the parity check alone and may be handled by performing a full SEC check after the data has been delivered. The full SEC check raises a signal to alert the processor system 200 that incorrect data having an even number of error bits have been delivered. An action can be performed by the processor system 200 to stop or restart execution of an operation using the data item 310 or raise an alert to a surrounding system, depending on a system design of the processor system 200. Multiple bit errors in the same set 402 often occur from a single error event (such as one radiation impact), which can be minimized by assigning the bits of the data word 312 and integrity bits 314 that are not adjacent to each other into the same data set 402. In an example (e.g., FIG. 8), each parity bit 802, corresponding data bits 312, the SEC bit 318 covered by the parity bit 802 are separated from each other (e.g., any two bits of the aforementioned bits has a maximal bit distance). For example, every two data bits 312 assigned to the same data set 402 are separated by at least three data bits 312.

In some embodiments, all the data bits 312 of each data word 402 are stored in a row with even distance, and the bit number of the data corresponds to the actual physical location where that individual bit of memory is stored. The data bits 312 are alternatingly assigned into different data sets 402 with an optimal bit distance (e.g., when every two bits in the same data set 402 has a furthest distance as possible). In the example of FIG. 8, each bit 312 in a data set 402 has a distance of four bit positions from any other data bit 312 in the data same set 402. If a number of multiple-bit errors occurs to a number of adjacent bits, the overall parity error indication bit 808 may not catch the error. However, each of the even number of data sets 402 has a respective single data bit error. The same number of regenerated parity bits 802 indicate which data sets 402 have error bits, and the SEC code bits can be used to determine where the multiple bit errors are located. In some embodiments, two, three or four adjacent error bits can be detected based on the data structure 300.

In an example, d[9] and d[10] are two adjacent error bits 910 stored in a memory. Referring to FIG. 8, given that the integrity bits 314 are properly generated based on the original data bits 312, the parity bits 314 are correct, and the regenerated parity bits c[5] and e[6] indicate that the data sets 402B and 40C have errors, so does the overall parity bit indicate the errors. Two parity bits have a mismatch, and the errors are not correctable. Referring to FIG. 9, when the data bits 312 are combined to generate the coding bits 406, the data set 402B has p1[0] and p1[3] do not match the SEC code bits 318, and the data set 402C has p2[0] and p2[3] do not match the SEC code bits 318. However, individual SEC code bits for the second and third data sets 402B and 420C are not available separately. Thus, errors with adjacent bits d[9] and d[10] are detected through the parity check but cannot be corrected directly, and the integrated data item 310 needs to be reloaded into the memory.

In another example, d[22]-d[25] are four adjacent error bits 912 stored in the memory. Referring to FIG. 8, given that the integrity bits 314 are properly generated based on the original data bits 312, the parity bits 314 are correct, and the regenerated parity bits e[4]-e[7] indicate that all of the data sets 402A-402D have errors, so does the overall parity bit indicate the errors. Four parity bits have a mismatch, and the errors 912 are not correctable. Referring to FIG. 9, when the data bits 312 are combined to generate the coding bits 406, each and every data set 402B has mismatch with the SEC code bits 318. Given individual SEC code bits for the data sets 402A-420D are not available separately, the four adjacent error bits 912 are detected but cannot be corrected directly, and the integrated data item 310 needs to be reloaded into the memory.

FIG. 10 is a table 1000 summarizing different types of data errors detected during a decoding process, in accordance with some embodiments. Each integrated data item 310 includes a first number of data bits 312, a set of SEC code bits 318, and a set of parity bits 316. Data stored in a cache normally have a low bit error ratio, e.g., one erroneous bit per billion bits read out or even less would be considered a typical order of magnitude. Among errors of the data stored in the cache, the most common errors are single bit errors occurring to any single bit of the data bits 312, SEC code bits 318, and parity bits 316, which are jointly identified by the same memory address. The SEC code bits 318 and parity bits 316 can be applied to identify single bit errors in the data bits 312 associated with the same memory address easily, thereby covering the most common errors in the data bits stored in a cache associated with a processor 102. Less common errors include multiple erroneous bits occurring concurrently in the same integrated data item 310. In some embodiments, such multi-bit upsets are avoided on an SRAM design level using scrambling (by spreading out adjacent bits to different memory addresses).

The first number of data bits 312 are assigned to a second number of data sets 402, and each data set 402 corresponds to a third number of respective coding bits 406 and a respective coding pattern. For each data set 402, the processor 102 determines whether the respective data set 402 is associated with a parity error based on respective data bits 312, a respective subset of SEC code bits 318, and a respective parity bit 316. In accordance with a determination that there is no parity error among the second number of data sets 402, the processor 102 determines (1002) that the integrated data item 310 is correctly stored into and extracted from the cache. Further, in some situations, the processor 102 may in addition verify that there is no mismatch between the SEC code bits and the SEC check bits, before determining (1008) that all bits of the integrated data item 310 are correct. This provides a more comprehensive approach allowing the processor 102 to catch potential double-bit errors not detectable using the parity check alone (1002).

In accordance with a determination that only a first data set 402 (e.g., 402A) has a parity error among the second number of data sets 402, the processor 102 detects (1004) an error with a first data bit 312 of the first data set 402 based on the set of SEC code bits 318 and the respective coding pattern of the first data set 402, and corrects the error in the first data bit 312 of the first data set 402. Specifically, in some embodiments, there is a mismatch between a first subset of the SEC code bits 318 extracted from the cache and a corresponding subset of the SEC check bits regenerated from the data bits 312 of the first data set 402. The processor determines that the first subset of the SEC code bits 318 correspond to the first data bit in the first data set according to the corresponding coding pattern. More details on detecting and correcting a single bit error are discussed above with reference to FIGS. 8 and 9.

Alternatively, in some embodiments, the processor 102 determines that only a second data set 402B corresponds to a parity error among the second number of data sets 402 (e.g., in FIG. 8) and that there is only a single mismatch (1006) between one of the SEC code bits 318 and a corresponding bit of the SEC check bits 906 (e.g., in FIG. 9). The one of the SEC code bits 318 of the second data set 402 (i.e., c[1]) is erroneous, and therefore, the processor 102 corrects the one of the SEC code bits 318 (i.e., c[1]) corresponding to the second data set 402B.

Under some circumstances, there is no mismatch between the SEC code bits 318 extracted from the cache and the SEC check bits 906 regenerated from the data bits 312. The processor 102 determines (1010) that only a third data set 402 (e.g., 402C) has a parity error among the second number of data sets 402, and corrects the parity bit 316 (e.g., c[6]) corresponding to the third data set 402 because this parity bit (not any SEC code bit 318) is erroneous.

In some situations, the processor 102 determines that there is no parity error in the data sets 402, and however, there is a mismatch (1012) between a second subset of the SEC code bits 318 extracted from the cache and a corresponding subset of the SEC check bits 906 generated from the data bits 312. The processor 102 generates a request to reload the integrated data item 310 from higher level cache (208, 210) or from external memory 104, because there are multiple erroneous bits in the integrated data items 310 extracted from the cache. Alternatively, in some situations, only the first data set 402 has a parity error among the second number of data sets. The processor 102 determines that there is a mismatch between a fourth subset of the SEC code bits 318 extracted from the cache and a corresponding subset of the SEC check bits 906 generated from the data bits 312. However, the fourth subset of the SEC code bits do not correspond (1014) to any data bit 312 in the first data set according to the corresponding coding pattern. The processor 102 generates a request to reload the data item 310 from higher level cache (208, 210) or from external memory 104, because two or more data bits 312 are erroneous in the first data set.

Decoding of data stored in a cache can be described as a 3-stage process (e.g., process 1200 in FIG. 12) including error detection using parity bits, coding pattern based syndrome generation, and error identification and/or correction. In some situations, the decoding process is completed over two or more clock cycles, and for example, error detection and correction may occur in two successive cycles. When an error is detected, a processor pipeline 250 is stalled to allow extra cycles to correct the error or reload the corresponding data item. In some implementation of this application, error detection and correction occur in one cycle without stalling the processor pipeline.

Referring to FIG. 10, coding patterns and parity check are applied together to identify and correct most common single bit errors directly. As shown in table 1 in FIG. 10, if two-four parity bits 316 are erroneous, there are (1012) multiple erroneous data bits 312 that cannot be corrected directly without reloading the data item 310. Alternatively, when only one parity bit 316 is erroneous, no other bits are erroneous except this parity bit 316 (1010) if all SEC code bits are correct, and an SEC code bit is (1006) erroneous if only this SEC code bit has a mismatch. When only one parity bit 316 is erroneous and 2-4 SEC code bits show mismatches, the 2-4 SEC code bits are checked with reference to the coding patterns 404 of the data sets 402. If the 2-4 SEC code bits matches a bit according to the respective coding pattern 404, a single bit error is identified and may be corrected (1004) within the data set 402 associated with the only one parity bit 316. Conversely, if the 2-4 SEC code bits does not match any bit according to the respective coding pattern 404, an uncorrectable multi-bit error is identified (1014) within the data set 402 associated with the only one parity bit 316. Additionally, if all parity bits 316 are correct and there is no mismatch with the SEC code bits 318, all data bits 312 are correct (1008), and however, if all parity bits 316 are correct and there is one or more mismatches with the SEC code bits 318, there may be a multi-bit error that is not correctable directly without reloading the data item 310.

FIG. 11 is a flowchart of a method 1100 implemented by a processor 102 for protecting data, in accordance with some embodiments. The processor 102 obtains (1102) a first number of data bits 312 and assigns (1104) the first number of data bits 312 into a second number of data sets 402. Each data set 402 includes (1106) a respective subset of data bits and corresponds to a third number of respective coding bits 406 and a respective coding pattern, e.g., for providing a unique combination of at least two of the respective coding bits 406 for each data bit 312 in the respective data set 402. For each of the data sets 402, the processor 102 combines (1108) data bits 312 of that respective data set 402 to generate the third number of respective coding bits 406 based on the respective coding pattern 404 (e.g., 500 and 540 in FIGS. 5A and 5C). The processor 102 generates (1110) a plurality of integrity bits 314 including a set of SEC code bits 318 and a set of parity bits 316. For each of the SEC code bits 318, the processor 102 combines (1112) a respective bit of the third number of respective coding bits 406 of each of the second number of data sets 402 to generate the respective SEC code bit 318. For each of the parity bits 316, the processor 102 combines (1114) a respective subset of SEC code bits 318 and data bits 312 in a respective one of the second number of data sets 402 to generate the respective parity bit. In some embodiments, each of the SEC code bits 318 and parity bits 316 is generated based on a respective multi-input exclusive-or (XOR) logic. The plurality of integrity bits 314 are then stored (1116) in a cache (e.g., a core cache 206) with the first number of data bits 312.

In some embodiments, the second number of data sets 402 includes a first data set 402A and a second data set 402B distinct from the first data set 402A. The first data set 402A corresponds to a first coding pattern (e.g., pattern 500 in FIG. 5A), and the second data set 402B corresponds to a second coding pattern (e.g., pattern 540 in FIG. 5B) that is different from the first coding pattern.

In some embodiments, for each data set 402, each data bit 312 of the respective data set 402 is configured to determine at least two of the third number of respective coding bits 406 according to the respective coding pattern 404. Referring to FIGS. 5A and 5B, 4 coding bits 406 are used to code 8 data bits. Each data bit 312 is coded with 2 or 3 coding bits 406.

In some embodiments, the cache includes a level-one (L1) cache (e.g., a core cache 206) coupled to one or more processors 102, and the first number of data bits 312 are part of one or more instructions prefetched into the cache to be implemented by the one or more processors 102.

In some embodiments, the first number of data bits 312 includes 32 data bits, and are stored with 8 integrity bits 314. Further, in some embodiments, the second number is equal to 4, and the third number is equal to 4. The plurality of integrity bits 314 include four SEC code bits 318 and four parity bits 316. For each data set 402, the respective subset of SEC code bits 318 used to generate the respective parity bit 316 includes a distinct one of the 4 SEC code bits 318. For example, referring to FIG. 6, the parity bit 316A, 316B, 316C, or 316D is generated from the SEC code bit 318A, 318B, 318C, or 318D, respectively. Alternatively, in some embodiments, the second number is equal to 2, and the third number is equal to 6. For each data set 402, the respective subset of SEC code bits 318 used to determine whether the respective data set 402 has a parity error may include more than one (e.g., 3) of the SEC code bits 318.

In some embodiments, for each of the second number of data sets 402, the processor 102 assigns a plurality of consecutive bits (e.g., d[0]-d[7], d[8]-d[15], d[16]-d[23], d[24]-d[31]) in the first number of data bits 312 to the respective data set 402. Alternatively, in some embodiments, for each of the second number of data sets 402, the processor 102 assigns one in every second number of consecutive data bits 312 of the first number of bits 312 into the respective data set 402 according to a predefined alternating order. For example, each of the eight consecutive data bits d[0]-d[7] is assigned to a distinct data set 402.

After the first number of data bits 312 are stored with the plurality of integrity bits, the processor 102 extracts, from the cache, the plurality of integrity bits with the first number of data bits 312, and assigns the first number of data bits 312 to the second number of data sets 402. For each data set, it is determined whether the respective data set has a parity error based on respective data bits, a respective subset of SEC code bits 318, and a respective parity bit 316. In accordance with a determination that there is no parity error among the second number of data sets, the processor 102 determines that the first number of data bits 312 are correctly stored and extracted.

FIG. 12 is a flowchart of a method 1200 implemented by a processor 102 to decoding data, in accordance with some embodiments. During the course of decoding the data, the processor 102 extracts the data from a cache, verifies integrity of the data, and corrects errors if needed. The processor obtains (1202) a data item stored in a cache. The data item includes (1204) a first number of data bits 312 and a plurality of integrity bits 314 having a set of SEC code bits 318 and a set of parity bits 316. In an example, the data item includes 32 data bits and 8 integrity bits. The first number of data bits 312 are assigned (1206) to a second number of data sets 402. Each data set 402 includes a respective subset of data bits and corresponds (1208) to a third number of respective coding bits 406 and a respective coding pattern. For each of the data sets, the processor 102 determines (1210) whether the respective data set 402 has or is associated with a parity error based on respective subset of data bits 312, a respective subset of SEC code bits 318, and a respective parity bit 316. In accordance with a determination that there is no parity error among the second number of data sets, the processor 102 determines (1212) that the data item 310 is correctly stored and extracted. In accordance with a determination that only a first data set 402 (e.g., 402A) has a parity error among the second number of data sets 402, the processor 102 detects (1214) an error with a first data bit 312 of the first data set 402 (e.g., 402A) based on the set of SEC code bits

318 and the respective coding pattern of the first data set, and corrects the error in the first data bit of the first data set.

In some embodiments, for each data set 402, the respective data bits 312 are combined to determine the third number of respective coding bits 406 based on the respective coding pattern. A set of SEC check bits 906 are generated. Each SEC check bit 906 is a combination of a respective bit of the third number of respective coding bits 406 of each of the second number of data sets 402. The SEC code bits 318 and the SEC check bits 906 are compared, e.g., each of the SEC code bits 318 is directly combined with the respective bit of the third number of respective coding bits 406 of each of the second number of data sets 402. Referring to FIG. 9, in some embodiments, in accordance with a determination that only the first data set 402 (e.g., 402A) has a parity error among the second number of data sets, the processor 102 detects the error with the first data bit 312 of the first data set 402 (e.g., in operation 1004 in FIG. 10) by determining that there is a mismatch between a first subset of the SEC code bits 318 and a corresponding subset of the SEC check bits 906 and determining that the first subset of the SEC code bits 318 correspond to the first data bit 312 in the first data set 402A according to the corresponding coding pattern. Alternatively, in some embodiments, in accordance with a determination that only a second data set 402 (e.g., 402B) has a parity error among the second number of data sets, the processor 102 determines that there is only a mismatch between one of the SEC code bits 318 and a corresponding bit of the SEC check bits 906, and corrects the one of the SEC code bits 318 in the second data set 402 (e.g., in operation 1006 in FIG. 10).

In some embodiments, the processor 102 determines that the data item 310 is correctly stored and extracted by in accordance with a determination that there is no mismatch between the SEC code bits 318 and the SEC check bits 906, determining that all bits of the data item are correct (e.g., in operation 1008 in FIG. 10). Conversely, in some embodiments, in accordance with a determination that there is no mismatch between the SEC code bits 318 and the SEC check bits 906, the processor 102 determines that only a third data set 402 (e.g., 402C) has a parity error among the second number of data sets, and corrects the parity bit corresponding to the third data set 402, (e.g., in operation 1010 in FIG. 10).

In some embodiments, in accordance with a determination that there is no parity error in the data sets 402, the processor 102 determines that there is a mismatch between a second subset of the SEC code bits 318 and a corresponding subset of the SEC check bits 906 and generates a request to reload the data item (e.g., in operation 1012 in FIG. 10). Alternatively, in some embodiments, in accordance with a determination that only the first data set 402 (e.g., 402A) has a parity error among the second number of data sets 402, the processor 102 determines that there is a mismatch between a fourth subset of the SEC code bits 318 and a corresponding subset of the SEC check bits 906 and that the fourth subset of the SEC code bits 318 do not correspond to any data bit 312 in the first data set 402 (e.g., 402A) according to the corresponding coding pattern. A request is generated o reload the data item 310 (e.g., in operation 1014 in FIG. 10).

In some embodiments, the second number of data sets 402 includes the first data set and a second data set distinct from the first data set. The first data set corresponds to a first coding pattern, and the second data set corresponds to a second coding pattern that is different from the first coding pattern. In some embodiments, for each data set 402, each data bit 312 of the respective data set 402 is configured to determine at least two of the third number of respective coding bits 406 according to the respective coding pattern.

In some embodiments, the cache includes a level-one (L1) cache coupled to one or more processors, and the data item 310 is part of one or more instructions prefetched into the cache to be implemented by the one or more processors.

In some embodiments, for each of the second number of data sets 402, a plurality of consecutive bits 312 in the first number of data bits 312 are assigned to the respective data set 402. Alternatively, in some embodiments, every second number of consecutive data bits are assigned successively into each of the second number of data sets according to a predefined alternating order. For example, the data bits d[0]-d[3] are successively assigned to four data sets 402.

In some embodiments, the data item includes 32 data bits and 8 integrity bits. The second number is equal to 4, and the third number is equal to 4. For each data set 402, the respective subset of SEC code bits 318 used to determine whether the respective data set has a parity error includes a distinct one of the SEC code bits 318. Alternatively, in some embodiments, the second number is equal to 2, and the third number is equal to 6. For each data set, the respective subset of SEC code bits used to determine whether the respective data set has a parity error may include more than one (e.g., 3) of the SEC code bits 318.

FIG. 13A is a flowchart of a comprehensive method 1300 implemented by a processor 102 to decoding data using both parity check and SEC bit check, in accordance with some embodiments. During the course of decoding the data, the processor 102 obtains (1302) a data item 310 stored in a memory. The data item 310 includes a first number of data bits 312 and a plurality of integrity bits 314 having a set of SEC code bits 318 and a set of parity bits 316. In an example, the data item includes 32 data bits and 8 integrity bits. The first number of data bits 312 are assigned (1304) to a second number of data sets 402. Each data set 402 includes a respective subset of data bits and corresponds to a third number of respective coding bits 406 and a respective coding pattern. For each of the data sets 402, the processor 102 determines (1306) whether the respective data set 402 has or is associated with a parity error based on respective subset of data bits 312, a respective subset of SEC code bits 318, and a respective parity bit 316. For each of the data sets 402, the processor 102 determines (1308) whether the respective data set 402 has errors in SEC integrity bits 406 regenerated from the extracted data bits 312 by comparing the SEC code bits 318 with SEC integrity bits 406. Based on a parity error status and a SEC error status, the processor 102 determines (1310) whether each data set 402 has no error, a single bit error, and multiple bit errors, and locations of the single bit or multiple bit errors.

In some situations, the data sets 402 have no error, and the data bits 312 are extracted without any modification from original data. The processor 102 indicates (1312) that the data item 310 is free of data error, and executes (1314) an instruction based on the data item 310. Alternatively, in some situations, the data sets 402 has a single bit error detected via the parity check and SEC check. The single bit error is (1316) inverted, and the processor 102 indicates that the data item 310 has a correctable single bit error. The processor 102 optionally corrects (1318) the single bit error in the cache as well in some situations, and executes (1320) an instruction based on the corrected data item 310. Further, alternatively, in some situations, the data item 310 has multiple bit errors detected via the parity check and SEC check. The processor 102 indicates (1322) that the data item 310 has an uncorrectable data error, requests (1324) reloading of the data item 310 from another memory (e.g., memory 104 in FIG. 2A), and executes (1326) an instruction based on the reloaded data item 310. Conversely, in some situations, the data sets 402 has multiple bit errors detected via the parity check and SEC check. The processor 102 determines that the multiple bit errors occur to adjacent data bits, and indicates that the data item 310 has a correctable data error. Based on the parity check and SEC check, the processor 102 corrects the multiple bit errors of the data item 310, and executes an instruction based on the corrected data item 310.

FIG. 13B is a flowchart of a simplified method 1350 implemented by a processor 102 to decoding data using both parity check and SEC bit check, in accordance with some embodiments. During the course of decoding the data, the processor 102 obtains (1352) a data item 310 stored in a memory. The data item 310 includes a first number of data bits 312 and a plurality of integrity bits 314 having a set of SEC code bits 318 and a set of parity bits 316. In an example, the data item includes 32 data bits and 8 integrity bits. The first number of data bits 312 are assigned (1354) to a second number of data sets 402. Each data set 402 includes a respective subset of data bits and corresponds to a third number of respective coding bits 406 and a respective coding pattern. For each of the data sets 402, the processor 102 determines (1356) whether the respective data set 402 has or is associated with a parity error based on respective subset of data bits 312, a respective subset of SEC code bits 318, and a respective parity bit 316.

In some situations, the data item 310 has no parity error. The processor 192 returns (1358) the data item 310 and indicates that the data item 310 has no error. The processor 102 executes (1360) an instruction based on the data item 310 and subsequent instructions. After delivering the data item 310, the processor 102 determines (1362) whether each data set 402 has errors in SEC integrity bits 406 regenerated from the extracted data bits 312 by comparing the SEC code bits 318 with SEC integrity bits 406. If there is no SEC error (i.e., SEC mismatches), no further action is taken (1364). Conversely, if the SEC integrity bits 406 and SEC code bits 318 do not match for any of the data sets 402, the processor 102 sends (1366) a message alerting a processor pipeline that erroneous data has been delivered due to undetected and uncorrected errors. The processor 102 continues to take (1368) a corrective action, e.g., raise an alarm signal or perform a system reset.

In some situations, the parity check indicates that the data item 310 has one or more parity errors. The processor 102 determines (1370) whether each data set 402 has errors in SEC integrity bits 406 regenerated from the extracted data bits 312 by comparing the SEC code bits 318 with SEC integrity bits 406. Based on a parity error status and a SEC error status, the processor 102 determines (1372) whether the data item 310 has a single bit error and multiple bit errors, and locations of the single bit or multiple bit errors. When the data set 310 has a single bit error, the single bit error is (1374) inverted, and the processor 102 indicates that the data item 310 has a correctable single bit error. The processor 102 optionally corrects (1376) the single bit error in the cache as well in some situations, and executes (1378) an instruction based on the corrected data item 310. When the data item 310 has multiple bit errors, the processor 102 indicates (1380) that the data item 310 has an uncorrectable data error, requests (1382) reloading of the data item 310 from another memory (e.g., memory 104 in FIG. 2A), and executes (1384) an instruction based on the reloaded data item 310. Conversely, in some situations, the data sets 402 has multiple bit errors detected via the parity check and SEC check. The processor 102 determines that the multiple bit errors occur to adjacent data bits, and indicates that the data item 310 has a correctable data error. Based on the parity check and SEC check, the processor 102 corrects the multiple bit errors of the data item 310, and executes an instruction based on the corrected data item 310.

Each of the methods 1100 and 1200 is, optionally, governed by instructions that are stored in a non-transitory computer readable storage medium and that are executed by one or more processors 102 of an electronic device. Each of the operations shown in FIGS. 11 and 12 may correspond to instructions stored in a computer memory or non-transitory computer readable storage medium. The computer readable storage medium may include a magnetic or optical disk storage device, solid state storage devices such as Flash memory, or other non-volatile memory device or devices. The instructions stored on the computer readable storage medium may include one or more of: source code, assembly language code, object code, or other instruction format that is interpreted by one or more processors. Some operations in each of the methods 1100 and 1200 may be combined and/or the order of some operations may be changed.

It should be understood that the particular order in which the operations in FIGS. 11 and 12 have been described are merely exemplary and are not intended to indicate that the described order is the only order in which the operations could be performed. One of ordinary skill in the art would recognize various ways to reorder the operations described herein. Additionally, it should be noted that details of processes described herein with respect to methods 1100 and 1200 (e.g., FIGS. 11 and 12) are also applicable in an exchangeable manner. For brevity, these details are not repeated.

The above description has been provided with reference to specific embodiments. However, the illustrative discussions above are not intended to be exhaustive or to be limiting to the precise forms disclosed. Many modifications and variations are possible in view of the above teachings. The embodiments were chosen and described in order to best explain the principles disclosed and their practical applications, to thereby enable others to best utilize the disclosure and various embodiments with various modifications as are suited to the particular use contemplated.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

This application is directed to protecting a data item by storing data bits with integrity bits. The data bits are assigned into a second number of data sets. Data bits of each data set are combined to determine a third number of respective coding bits based on a respective coding pattern. The integrity bits include a set of single-bit error correcting (SEC) code bits and a set of parity bits. Each SEC code bit is a combination of a respective bit of the third number of respective coding bits of each of the second number of data sets, and each parity bit is a combination of a respective subset of SEC code bits and data bits in a respective one of the second number of data sets. These integrity bits are stored with the first number of data bits in a memory for protecting the data item.

This application is also directed to detecting and/or correcting data errors. A data item is stored in a memory and has a first number of data bits and a plurality of integrity bits. The integrity bits include a set of single-bit error correcting (SEC) code bits and a set of parity bits. The first number of data bits are assigned to a second number of data sets. Each data set is checked to determine whether the respective data set has a parity error based on respective data bits, a respective subset of SEC code bits, and a respective parity bit. When a first data set has a parity error among the second number of data sets, an error is detected and corrected with a first data bit of the first data set based on the set of SEC code bits and a respective coding pattern of the first data set.

What is claimed is:

1. An electronic device, comprising:
   one or more processors;
   a memory coupled to the one or more processors; and
   memory having instructions stored thereon, which when executed by the one or more processors cause the processors to perform:
      obtaining a first number of data bits;
      assigning the first number of data bits into a second number of data sets, such that each data set includes a respective subset of data bits;

for each of the data sets, combining data bits of that respective data set to generate a third number of respective coding bits based on a respective coding pattern;
      generating a plurality of integrity bits including a set of singe-bit error correcting (SEC) code bits and a set of parity bits, including:
         for each of the SEC code bits, combining a respective bit of the third number of respective coding bits of each of the second number of data sets to generate the respective SEC code bit; and
         for each of the parity bits, combining a respective subset of SEC code bits and data bits in a respective one of the second number of data sets to generate the respective parity bit; and
      storing in the memory the plurality of integrity bits with the first number of data bits.

2. The electronic device of claim 1, wherein each of the SEC code bits and parity bits is generated based on a respective multi-input exclusive-or (XOR) logic.

3. The electronic device of claim 1, wherein the second number of data sets includes a first data set and a second data set distinct from the first data set, the first data set corresponding to a first coding pattern, the second data set corresponding to a second coding pattern that is different from the first coding pattern.

4. The electronic device of claim 1, wherein for each data set, each data bit of the respective data set is configured to determine at least two of the third number of respective coding bits according to the respective coding pattern.

5. The electronic device of claim 1, wherein the memory includes a level-one (L1) cache coupled to one or more processors, and the first number of data bits are part of one or more instructions prefetched into the memory to be implemented by the one or more processors.

6. The electronic device of claim 1, wherein the first number of data bits includes 32 data bits, and are stored with 8 integrity bits.

7. The electronic device of claim 6, wherein:
   the second number is equal to 4, and the third number is equal to 4;
   the plurality of integrity bits include 4 SEC code bits and 4 parity bits; and
   for each data set, the respective subset of SEC bits used to generate the respective parity bit includes a distinct one of the 4 SEC code bits.

8. The electronic device of claim 1, assigning the first number of data bits into the second number of data sets further comprising one of:
   for each of the second number of data sets, assigning a plurality of consecutive bits in the first number of data bits to the respective data set; and
   for each of the second number of data sets, assigning one in every second number of consecutive data bits of the first number of bits into the respective data set according to a predefined alternating order.

9. The electronic device of claim 1, the memory further storing instructions for:
   extracting, from the memory, the plurality of integrity bits with the first number of data bits;
   assigning the first number of data bits into the second number of data sets;
   for each data set, determining whether the respective data set has a parity error based on respective data bits, a respective subset of SEC code bits, and a respective parity bit; and in accordance with a determination that there is no parity error among the second number of data sets, determining that the first number of data bits are correctly stored and extracted.

10. The electronic device of claim 1, wherein:

for each of the SEC code bits, respective bits of the third number of respective coding bits of the second number of data sets are combined without the data bits of the data sets to generate the respective SEC code bit;

for each of the parity bits, the respective subset of SEC code bits and data bits in the respective one of the second number of data sets are combined without the respective coding bits corresponding to the data sets to generate the respective parity bit; and the set of parity bits has the second number of parity bits.

11. A method of correcting data errors, the method comprising:

obtaining a data item stored in a memory, the data item including a first number of data bits and a plurality of integrity bits having a set of singe-bit error correcting (SEC) code bits and a set of parity bits;

assigning the first number of data bits into a second number of data sets, each data set including a respective subset of data bits and corresponding to a respective parity bit, a third number of respective coding bits and a respective coding pattern;

for each of the data sets, determining whether the respective data set has a parity error, including at least combining the respective subset of data bits, a respective subset of SEC code bits, and the respective parity bit by a logical operation, wherein the respective subset of SEC code bits includes a distinct one of the set of SEC code bits;

in accordance with a determination that there is no parity error among the second number of data sets, determining that the data item is correctly stored and extracted; and in accordance with a determination that only a first data set has a parity error among the second number of data sets, detecting an error with a first data bit of the first data set based on the set of SEC code bits and the respective coding pattern of the first data set, and correcting the error in the first data bit of the first data set.

12. The method of claim 11, further comprising:

for each data set, combining the respective data bits to determine the third number of respective coding bits based on the respective coding pattern;

generating a set of SEC check bits, each SEC check bit being a combination of a respective bit of the third number of respective coding bits of each of the second number of data sets; and comparing the SEC code bits and the SEC check bits.

13. The method of claim 12, wherein in accordance with a determination that only a first data set has a parity error among the second number of data sets, detecting the error with the first data of the first data set further comprises:

determining that there is a mismatch between a first subset of the SEC code bits and a corresponding subset of the SEC check bits; and determining that the first subset of the SEC code bits correspond to the first data bit in the first data set according to the corresponding coding pattern.

14. The method of claim 12, further comprising:

in accordance with a determination that only a second data set corresponds to a parity error among the second number of data sets, determining that there is only a mismatch between one of the SEC code bits and a corresponding bit of the SEC check bits, and correcting the one of the SEC code bits corresponding to the second data set.

15. The method of claim 12, determining that the data item is correctly stored and extracted further comprising:

in accordance with a determination that there is no mismatch between the SEC code bits and the SEC check bits, determining that all bits of the data item are correct.

16. The method of claim 12, further comprising:

in accordance with a determination that there is no mismatch between the SEC code bits and the SEC check bits, determining that only a third data set has a parity error among the second number of data sets, and correcting the parity bit corresponding to the third data set; and in accordance with a determination that there is no parity error in the data sets, determining that there is a mismatch between a second subset of the SEC code bits and a corresponding subset of the SEC check bits and generating a request to reload the data item.

17. The method of claim 11, further comprising:

determining that there is a parity error with each of a subset of data sets; and detecting errors with adjacent data bits that are assigned to the subset of data sets based on the respective coding pattern of each data set, and correcting the errors in the adjacent data bits.

18. The method of claim 11, wherein the second number of data sets includes the first data set and a second data set distinct from the first data set, the first data set corresponding to a first coding pattern, the second data set corresponding to a second coding pattern that is different from the first coding pattern.

19. The method of claim 11, wherein for each data set, each data bit of the respective data set is configured to determine at least two of the third number of respective coding bits according to the respective coding pattern; and the memory includes a level-one (L1) cache coupled to one or more processors, and the data item is part of one or more instructions prefetched into the memory to be implemented by the one or more processors.

20. The method of any of claim 11, assigning the first number of data bits to the second number of data sets further comprising one of:

for each of the second number of data sets, assigning a plurality of consecutive bits in the first number of data bits to the respective data set; and assigning every second number of consecutive data bits successively into each of the second number of data sets according to a predefined alternating order;

wherein for each of the data sets, the respective parity bit includes a distinct one of the set of parity bits.

* * * * *